(12) United States Patent
Rapoport

(10) Patent No.: US 10,495,704 B2
(45) Date of Patent: *Dec. 3, 2019

(54) SHUTTING ASSEMBLY FOR CLOSING AN ENTRANCE OF AN MRI DEVICE

(71) Applicant: Aspect Imaging Ltd., Shoham (IL)

(72) Inventor: Uri Rapoport, Moshav Ben Shemen (IL)

(73) Assignee: ASPECT IMAGING LTD., Shoham (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/969,290

(22) Filed: May 2, 2018

(65) Prior Publication Data

US 2018/0267117 A1  Sep. 20, 2018

Related U.S. Application Data

(63) Continuation of application No. 14/540,163, filed on Nov. 13, 2014, now Pat. No. 10,018,692.

(Continued)

(51) Int. Cl.
*G01R 33/28* (2006.01)
*G01R 33/421* (2006.01)
*G01R 33/422* (2006.01)

(52) U.S. Cl.
CPC ......... *G01R 33/288* (2013.01); *G01R 33/421* (2013.01); *G01R 33/422* (2013.01)

(58) Field of Classification Search
CPC ... G01R 33/288; G01R 33/421; G01R 33/422
See application file for complete search history.

(56) References Cited

U.S. PATENT DOCUMENTS

| 3,242,523 A | 3/1966 | Daley |
| 3,534,251 A | 10/1970 | Richards |

(Continued)

FOREIGN PATENT DOCUMENTS

| CN | 101029922 | 2/2007 |
| CN | 201267472 | 7/2009 |

(Continued)

OTHER PUBLICATIONS

Maramraju, Sri Harsha, et al. Electromagnetic interactions in a shielded PET/MRI system for simultaneous PET/MRI imaging in 9.4 T: evaluation and results, IEEE Transactions on Nuclear Science 59, 5 (2012): pp. 1892-1896.

(Continued)

*Primary Examiner* — Gregory H Curran
(74) *Attorney, Agent, or Firm* — Loeb & Loeb LLP

(57) ABSTRACT

A shutting assembly for a magnetic resonance imaging device (MRD) bore aperture, comprising at least one first movable portion and at least one second portion affixed to the MRD, wherein the shutting assembly further comprising a normally closed or normally open sliding mechanism. The sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD.

22 Claims, 7 Drawing Sheets

Related U.S. Application Data

(60) Provisional application No. 61/906,422, filed on Nov. 20, 2013.

(56) References Cited

U.S. PATENT DOCUMENTS

| | | | |
|---|---|---|---|
| 4,587,504 A | 5/1986 | Brown et al. | |
| 4,590,428 A | 5/1986 | Müller et al. | |
| 4,646,046 A | 2/1987 | Vavrek et al. | |
| 4,910,461 A | 3/1990 | Van Vaals | |
| 4,912,445 A | 3/1990 | Yamasaki et al. | |
| 4,977,585 A | 12/1990 | Boyd | |
| 5,012,217 A | 4/1991 | Palkovich et al. | |
| 5,028,872 A | 7/1991 | Nakabayashi | |
| 5,038,129 A | 8/1991 | Oue et al. | |
| 5,039,826 A | 8/1991 | Newland | |
| 5,065,760 A | 11/1991 | Krause et al. | |
| 5,159,929 A | 11/1992 | Morris et al. | |
| 5,243,286 A | 9/1993 | Rzedzian et al. | |
| 3,504,932 A | 4/1994 | Carlson | |
| 5,305,749 A | 4/1994 | Li et al. | |
| 5,323,776 A | 6/1994 | Blakeley et al. | |
| 5,572,131 A | 11/1996 | Rzedzian | |
| 5,594,200 A | 1/1997 | Ramsey | |
| 5,635,889 A | 6/1997 | Stelter | |
| 5,659,281 A | 8/1997 | Pissanetzky et al. | |
| 5,986,531 A | 11/1999 | Carrozzi | |
| RE36,679 E | 5/2000 | Zakhor et al. | |
| RE36,782 E | 7/2000 | Brown et al. | |
| 6,188,015 B1 | 2/2001 | Curran, Sr. et al. | |
| 6,215,309 B1 | 4/2001 | Rzedzian et al. | |
| 6,346,814 B1 | 2/2002 | Carrozzi et al. | |
| 6,546,814 B1 | 4/2003 | Choe et al. | |
| 6,711,430 B1 | 3/2004 | Ferris et al. | |
| 6,801,038 B2 | 10/2004 | Carrozzi et al. | |
| 6,873,156 B2 | 3/2005 | Ferris et al. | |
| 6,995,562 B2 | 2/2006 | Laskaris et al. | |
| 7,071,692 B2 | 7/2006 | Branch et al. | |
| 7,141,974 B2 | 11/2006 | Edelstein et al. | |
| 7,157,911 B2 | 1/2007 | Suzuki et al. | |
| 7,171,256 B1 | 1/2007 | Graessle et al. | |
| 7,375,526 B2 | 5/2008 | Edelstein et al. | |
| 7,529,575 B2 | 5/2009 | Rezzonico et al. | |
| 7,633,294 B2 | 12/2009 | Leussler et al. | |
| 7,715,895 B1 | 5/2010 | Graessle et al. | |
| 7,772,503 B2 | 8/2010 | Ginanneschi | |
| 7,801,613 B2 | 9/2010 | Li et al. | |
| 8,384,387 B1 | 2/2013 | Damadian et al. | |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 9,301,724 B2 | 4/2016 | McKnight et al. | |
| 9,470,769 B2 | 10/2016 | Bilu et al. | |
| 9,498,167 B2 | 11/2016 | Mostafavi et al. | |
| 9,562,956 B2 | 2/2017 | Rapoport | |
| 9,597,246 B2 | 3/2017 | Rapoport | |
| 9,655,291 B2 | 5/2017 | Ozaki et al. | |
| 2002/0057088 A1 | 5/2002 | Carrozzi et al. | |
| 2003/0016518 A1 | 1/2003 | Arz | |
| 2003/0058502 A1 | 3/2003 | Griffiths et al. | |
| 2003/0088175 A1 | 5/2003 | Branch et al. | |
| 2005/0046422 A1 | 3/2005 | Edelstein et al. | |
| 2005/0049491 A1 | 3/2005 | Rezzonico et al. | |
| 2006/0103383 A1 | 5/2006 | Tanabe | |
| 2006/0186884 A1 | 8/2006 | Mallett et al. | |
| 2007/0026733 A1 | 2/2007 | Greim et al. | |
| 2007/0135704 A1 | 6/2007 | Branch et al. | |
| 2007/0232894 A1 | 10/2007 | Feenan | |
| 2007/0276614 A1 | 11/2007 | Tan et al. | |
| 2008/0060843 A1 | 3/2008 | Ginanneschi | |
| 2008/0094062 A1 | 4/2008 | Edelstein et al. | |
| 2008/0186026 A1 | 8/2008 | Leussler et al. | |
| 2009/0072939 A1 | 3/2009 | Shen et al. | |
| 2009/0135578 A1 | 5/2009 | Mallett et al. | |
| 2009/0209846 A1 | 8/2009 | Bammer | |
| 2010/0000780 A1 | 1/2010 | Zhu et al. | |
| 2011/0162652 A1 | 7/2011 | Rapoport | |
| 2012/0046722 A1 | 2/2012 | Olsen et al. | |
| 2012/0071745 A1 | 3/2012 | Rapoport | |
| 2012/0118630 A1 | 5/2012 | Jiang et al. | |
| 2012/0119742 A1 | 5/2012 | Rapoport | |
| 2013/0229181 A1 | 9/2013 | Biber et al. | |
| 2013/0328560 A1 | 12/2013 | Rapoport | |
| 2014/0051976 A1 | 2/2014 | Rapoport et al. | |
| 2014/0117989 A1 | 5/2014 | Rapoport | |
| 2014/0139216 A1 | 5/2014 | Rapoport | |
| 2014/0266203 A1 | 9/2014 | Rapoport et al. | |
| 2014/0354279 A1 | 12/2014 | Dumoulin et al. | |
| 2014/0364722 A1 | 12/2014 | Dumoulin | |
| 2014/0378821 A1 | 12/2014 | Rapoport et al. | |
| 2015/0059655 A1 | 3/2015 | Rapoport | |
| 2015/0112186 A1 | 4/2015 | Rapoport et al. | |
| 2015/0137812 A1 | 5/2015 | Rapoport | |
| 2015/0141799 A1 | 5/2015 | Rapoport et al. | |
| 2015/0168519 A1 | 6/2015 | Rapoport | |
| 2015/0208994 A1 | 7/2015 | Rapoport | |
| 2015/0212172 A1 | 7/2015 | Rapoport | |
| 2015/0212173 A1 | 7/2015 | Rapoport | |
| 2015/0253400 A1 | 9/2015 | Rapoport | |
| 2015/0253401 A1 | 9/2015 | Rapoport | |
| 2016/0131724 A1* | 5/2016 | Balaban | G01R 33/28 324/322 |
| 2017/0146619 A1 | 5/2017 | Strauss et al. | |
| 2017/0176557 A1 | 6/2017 | Azulay et al. | |
| 2017/0256853 A1 | 9/2017 | Anderson et al. | |

FOREIGN PATENT DOCUMENTS

| | | |
|---|---|---|
| DE | 202013105276 | 2/2014 |
| EP | 0825450 | 8/1997 |
| GB | 2436875 | 4/2006 |
| JP | 62207448 | 9/1987 |
| JP | H013013139 | 12/1989 |
| JP | 2005270422 | 10/2005 |
| WO | WO1989004049 | 5/1989 |
| WO | WO1993021645 | 10/1993 |
| WO | WO00/16116 | 3/2000 |
| WO | WO2000001611 | 3/2000 |
| WO | WO2002003090 | 1/2002 |
| WO | WO2015071906 | 5/2015 |

OTHER PUBLICATIONS

Hart, Segmented and Shielded Structures for Reduction of Thermal Expansion-Induced Tilt Errors, Precision Engineering Research Group Massachusetts Institute of Technology, Oct. 2004, pp. 443-458.

* cited by examiner

SHUTTING ASSEMBLY FOR CLOSING AN ENTRANCE OF AN MRI DEVICE

CROSS-REFERENCE TO RELATED APPLICATIONS

This application is a continuation of U.S. patent application Ser. No. 14/540,163, filed Nov. 13, 2014 and U.S. Provisional Patent Application No. 61/906,422, filed Nov. 20, 2013, which are hereby all incorporated by reference in its entireties.

FIELD OF THE INVENTION

The present invention generally pertains to the field of magnetic resonance imaging devices; more particularly, the invention relates to a shutting assembly for closing an entrance of an MRI device and methods thereof.

BACKGROUND OF THE INVENTION

MRI technology utilizes magnetism and radio frequency for imaging of patients for medical diagnosis and research. Electromagnetic interference (EMI) that is generated in the process of MRI negatively affects other devices in its vicinity such as medical electrical devices, computers, data transfer components, other scanning devices, etc. In addition EMI generated from an external source such as electric lines, television and radio signals, elevators, etc., can impede MRI operation and results.

Facilities providing MRI services build specially designed rooms that allow MRI procedures to be shielded from these interferences, while preventing leakage of the same interferences to the outside.

This shielding may include passive or active components to achieve magnetic and RF shielding. For example, to achieve RF shielding, the walls, floor and ceiling are built from sheets of conductive metal such as copper, aluminum, etc., including a door that maintains a closed circuit with the walls. Magnetic shielding could be provided by constructing a magnetic shield around the RF shield. A passive solution involves using magnetic shielding material, typically metal or metal alloy. These materials would need to be comprised of a very high permeability material such as "mu-metal". The second option would be an active magnetic cancellation system, that would typically include a magnetometer, controller, amplifier and compensation coils. This solution tends to be costly and requires adjusting and handling.

An MRI scanner utilizes a very strong magnet, thus iron-containing unrestrained objects are drawn, making them airborne, into the magnet's bore. This hazardous phenomenon is known as the projectile, or missile, effect, which can potentially result in serious or fatal injuries to individuals in the scanner room. Numerous severe accidents were recorded at MRI facilities because of pulled iron-containing objects. Keeping the MRD bore open for the passage of medical equipment may leave a space through which projectile objects could enter.

Many patients are in need of medical support or monitoring during MRI. These include neonates, sedated patients, or other medically unstable patients. It is of critical importance to maintain life support and also to monitor conditions of these patients when undergoing MRI. Many of the life support devices, environmental conditions controlling devices and medical monitoring devices utilize electrical circuits may be interrupted by RF and magnetic fields.

In order to provide a passage for systems such as air conditioning, electrical wiring, communication devices, medical equipment, etc., into EMI shielded rooms, means such as waveguide attenuators and RF filters are used. All fluid and air passing tubes are threaded through a conduit that is configured to attenuate EMI, and all electrical or conductive wiring is connected through an RF filter to avoid coupling of RF to the conductive wire.

There is a long felt need for an apparatus that will provide RF and magnetic shielding, to the MRD and from the MRD. Further there is need for a passage that allows the patient's MRI procedure to take place while allowing passage for medical and life supporting equipment without compromising this shielding. In addition, there is a need for an apparatus that is easy to maneuver and will provide a physically shielded environment for the patient.

SUMMARY OF THE INVENTION

The present invention provides a shutting assembly for a magnetic resonance imaging device (MRD) bore aperture, comprising at least one first movable portion and at least one second portion affixed to the MRD, wherein the shutting assembly further comprises a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD.

It is another object of the current invention to disclose the shutting assembly as described above, wherein the shutting assembly is arranged such that when the shutting assembly moveable portion is placed over the MRD bore, the MRD bore aperture is completely covered by the shutting assembly.

It is another object of the current invention to disclose the shutting assembly as described above, wherein the normally closed sliding mechanism retains the MRD bore aperture covered by the shutting assembly, when force is not applied directly or indirectly to at least one movable portion.

It is another object of the current invention to disclose the shutting assembly as described above, wherein the normally opened sliding mechanism retains the MRD bore aperture uncovered by the shutting assembly, when force is not applied directly or indirectly to at least one movable portion.

It is another object of the current invention to disclose the shutting assembly as described above, wherein self-movement of at least one moveable portion relative to at least one portion affixed to the MRD enables the MRD bore aperture to be covered in the normally closed sliding mechanism or uncovered in the normally opened sliding mechanism.

It is another object of the current invention to disclose the shutting assembly as described above, wherein force triggered movement of at least one moveable portion relative to at least one portion affixed to the MRD enables the MRD bore aperture to be covered in the normally opened sliding mechanism, or uncovered in a normally closed sliding mechanism; further wherein the force is applied directly, indirectly or both.

It is another object of the current invention to disclose the shutting assembly as described above, wherein movement of at least one moveable portion relative to at least one portion affixed to the MRD is achieved by means selected from a group consisting of: manual, automatic, self or any combination thereof.

It is another object of the current invention to disclose the shutting assembly as described above, comprising at least one motion stopping mechanism, wherein the motion stopping mechanism is interconnected to a portion selected from a group consisting of: the MRD bore, the MRD external wall, at least one movable portion, at least one portion affixed to the MRD and any combination thereof.

It is another object of the current invention to disclose the shutting assembly as described above, wherein at least one affixed portion is connected to a portion selected from a group consisting of: the MRD bore, the MRD external wall, at least one movable portion, the sliding mechanism and any combination thereof.

It is another object of the current invention to disclose the shutting assembly as described above, wherein at least a part of one affixed portion is connected to the MRD external wall, in reference to the bore aperture, selected from a group consisting of: above, below, on top, bottom, left side, right side, perpendicular to the floor, non-perpendicular to the floor, around at least a portion of the MRD aperture, and any combination thereof.

It is another object of the current invention to disclose the shutting assembly as described above, wherein at least a part of one moveable portion is reversibly connected to a portion selected from a group consisting of: the MRD bore, the MRD external wall, at least one affixed portion, the sliding mechanism and any combination thereof.

It is another object of the current invention to disclose the shutting assembly as described above, wherein at least a portion of the shutting assembly comprises shielding selected from a group consisting of: magnetic shielding, RF shielding, physical shielding and any combination thereof.

It is another object of the current invention to disclose the shutting assembly as described above, wherein at least a portion of the shutting assembly comprises an at least partially transparent material.

It is another object of the current invention to disclose the shutting assembly as described above, wherein at least a portion of the shutting assembly is a semi-permeable barrier.

It is another object of the current invention to disclose the shutting assembly as described above, further comprising a one-step release mechanism, wherein the mechanism enables quick access to the patient when in the MRD bore.

It is another object of the current invention to disclose the shutting assembly as described above, wherein the shutting assembly further comprises at least one RF shielding conduit (RFSC), connected to the shutting assembly, shaped to allow passage of medical equipment tubing from the MRD bore to the external environment; further wherein the conduit is characterized by a length (l) and a width (w), l:w ratio is greater than a predefined value n, thereby providing RF shielding.

It is another object of the current invention to disclose the shutting assembly as described above, wherein at least a portion of the RFSC is shaped to accommodate medical equipment within.

It is another object of the current invention to disclose the shutting assembly as described above, wherein the RFSC is interconnected to a portion selected from a group consisting of: the shutting assembly movable portion, the shutting assembly portion affixed to the MRD, the MRD and any combination thereof.

It is another object of the current invention to disclose the shutting assembly as described above, wherein the RFSC is configured to attenuate electromagnetic interference by means selected from a group of: waveguide, RF filter, waveguide filter, attenuating material, and any combination thereof.

It is another object of the current invention to disclose the shutting assembly as described above, wherein the RFSC is configured by means of shape, size and material to attenuate the passage of frequencies selected from a group consisting of: 0-1000 MHz, 0-500 MHz, 0-200 MHz and any combination thereof.

It is another object of the current invention to disclose the shutting assembly as described above, wherein the RFSC shape is selected from a group consisting of: cylindrical, polygonal, symmetrical, non-symmetrical, opened, closed, curved, multifaceted and any combination thereof.

The present invention provides a method for physical shielding an MRD from pulled ferromagnetic objects, by providing a shutting assembly comprising at least one first movable portion and at least one second portion affixed to the MRD, comprising steps of: (a) obtaining an MRD and the shutting assembly; (b) installing the shutting assembly to the MRD; (c) inserting patient into the MRD bore; (d) moving the moveable portion such as to cover the MRD bore; and (e) imaging a patient; wherein the shutting assembly further comprises a normally closed or normally open sliding mechanism, further wherein the sliding mechanism couples at least one first moveable portion to at least one second portion affixed to the MRD.

The present invention provides a method for manufacturing a shutting assembly for a magnetic resonance imaging device (MRD) bore aperture, comprising at least one first movable portion and at least one second portion affixed to the MRD, consisting steps of: (a) defining dimensions of the MRD bore aperture; (b) defining dimensions of the movement range needed for the shutting assembly moveable portion to shift between covering to uncovering the MRD bore; and (c) forming the shutting mechanism; wherein the shutting assembly further comprises a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in upwards and downwards directions with respect to at least one second portion affixed to the MRD.

The present invention provides a method for RF shielding the passage of medical equipment to MRD bore comprising steps of: (a) obtaining a shutting assembly for a magnetic resonance device (MRD) bore aperture, comprising at least one first movable portion and at least one second portion affixed to the MRD, further comprising at least one conduit shaped to allow passage of medical equipment from the MRD bore to the external environment; (b) installing the shutting assembly; (c) placing patient within the MRI bore; (d) passing medical equipment though the conduit; (e) shutting the MRD bore by utilizing the shutting assembly sliding mechanism; and (f) imaging patient, wherein the conduit is characterized by a length (l) and width (w), l:w ratio is greater than a predefined value n, thereby providing RF shielding.

The present invention provides a standard of care protocol for magnetic resonance imaging a patient placed within MRD bore, connected to medical equipment, whilst not leaking RF into the MRD and from the MRD, characterized by providing a shutting assembly for a magnetic resonance imaging device (MRD) bore aperture, comprising at least one first movable portion and at least one second portion affixed to the MRD, the shutting assembly further comprising a normally closed or normally open sliding mechanism, further the sliding mechanism couples at least one first moveable portion to at least one second portion affixed to the MRD, further comprising at least one RF shielding conduit (RFSC), connected to the shutting assembly, shaped to allow passage of medical equipment tubing from the MRD bore to the external environment; further the conduit is characterized by a length (l) and a width (w), l:w ratio is greater than a predefined value n, thereby providing RF shielding, wherein at least one of the following is held true: (a) the average number of MRD associated patient's health complications due to detaching and attaching medical equipment to the patient is i times higher than when utilizing the shutting assembly i is equal or greater than 1.05; (b) the average number of insurable claims of a selected from a group consisting of: manufacturer, handler, user, operator, medical care personal, medical facility, medical facility management or any combination thereof when utilizing the shutting assembly is m times lower than patient MRI associated insurable claims; m is equal or greater than 1.05; (c) the average number of repeated MRI due to EMI created artifacts when utilizing the shutting assembly is p times lower than the average number of repeated MRI; p is equal or greater than 1.05; (d) the average number of reported incidents of EMI interfering with medical equipment during MRI when utilizing the shutting assembly is s times lower than the average number of reported incidents of EMI interfering with medical equipment during MRI; s is equal or greater than 1.05; (e) the average stress levels of patients measured by the average levels of the patient salival cortisol during MRI when utilizing the shutting assembly is t times lower than the average stress levels of patients during MRI; t is equal or greater than 1.05; (f) the average number of patient's health complications due to artifacts in MRD images caused by EMI is r times higher than when utilizing the shutting assembly; r is equal or greater than 1.05; (g) the average number of patient's health complications due EMI interfering with medical equipment is u times higher than when utilizing the shutting assembly; u is equal or greater than 1.05; (h) the average number of EMI incidents of interfering with imaging equipment is w times higher than when utilizing the shutting assembly; w is equal or greater than 1.05; and (i) the average number of projectile ferromagnetic elements related incidents is v times higher than when utilizing the shutting assembly; v is equal or greater than 1.05.

BRIEF DESCRIPTION OF THE FIGURES

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured. In the accompanying drawing:

DETAILED DESCRIPTION OF THE PREFERRED EMBODIMENTS

Figure 1A:
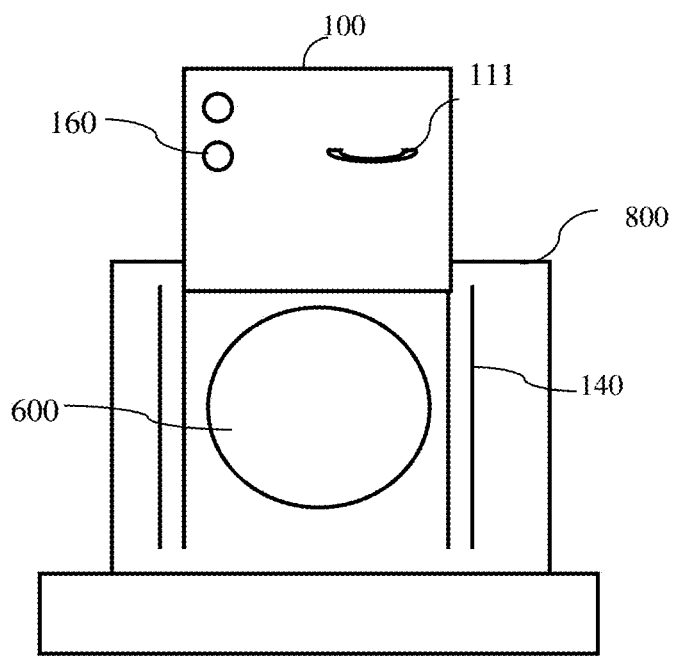
FIG. 1A is a schematic illustration of an embodiment of the present invention illustrating a shutting assembly for an entrance of a closed bore MRI scanner in its open configuration.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured. The present invention provides a shutting assembly for an MRI bore with means to facilitate the passage of medical equipment.

The essence of the present invention is to provide a shutting assembly, adapted by means of size shape and material to shut an MRD bore by way of a normally closed or normally opened sliding mechanism. In addition the present invention provides a shutting assembly for an MRD combined with a passage intended for accommodating at least a portion of medical equipment, configured to provide passage for the medical equipment tubing between the MRD bore and the external environment. Further, the conduit of the present invention is configured by dimensions and material to attenuate electromagnetic interference.

The shutting assembly of the present invention will increase the safety of MRI as the patient will be protected from the magnetic pull of ferromagnetic objects. Patient's well being will also be maintained by medical equipment able to pass through the conduit connected to the shutting assembly.

The term 'magnetic resonance device' (MRD), specifically applies hereinafter to any Magnetic Resonance Imaging (MRI) device, any Nuclear Magnetic Resonance (NMR) spectroscope, any Electron Spin Resonance (ESR) spectroscope, any Nuclear Quadruple Resonance (NQR) or any combination thereof. The term, in this invention, also applies to any other analyzing and imaging instruments comprising a volume of interest, such as computerized tomography (CT), ultrasound (US) etc. The MRD hereby disclosed is optionally a portable MRI device, such as the ASPECT-MR Ltd commercially available devices, or a commercially available non-portable device.

The term "closed bore MRI" refers hereinafter to MRI scanner that have a large cylinder-shape tube inside a MRI magnet.

The term "MRD bore" interchangeably refers hereinafter to a large cylinder-shaped tube of a MRI scanner which is designed to accommodate a patient.

The term "inner space of MRD bore" refers hereinafter to inner volume of a MRI bore.

The term "external environment" refers hereinafter to the external space outside of an MRI scanner.

The term "patient" interchangeably refers herein after to a term selected from a group of: neonate, baby, infant, toddler, child, adolescent, adult, elderly, etc.; further this term refers to person or animal. In addition the person or animal may be in contact with an object.

The term "medical equipment" interchangeably refers hereinafter to all devices, tubes, connectors, wires, liquid carriers, needles, sensors, etc., that are used by medical staff in association with the patient. This medical equipment is used for various purposes such as life support, ventilating, temperature regulating, MRI contras solution injection, monitoring of cardio and breathing rates, viewing the patient, fluids transport, performing surgical operation, moving at least a part of the patient, etc.

The term "medical equipment tubing" interchangeably refers hereinafter to all tubes, cables, connectors, wires, liquid carriers, gas carriers, electrical wires, monitoring cables, viewing cables, data cables etc. that are used in connection to medical equipment or physical environment maintenance or monitoring.

The term "normally closed" interchangeably refers herein after to a configuration of the shutting assembly where the moveable portion covers the MRD bore aperture in a resting position, restricting access to the MRD bore, whereas an application of force is needed in order to change the location of the moveable portion in reference to the portion affixed to the MRD. Once the force is terminated the movable portion will attempt to move back to a closed configuration.

The term "normally opened" interchangeably refers herein after to a configuration of the shutting assembly where the moveable portion does not cover the MRD bore aperture in a resting position, leaving open the entrance to the MRD bore. An application of force is needed to change the location of the moveable portion in reference to the portion affixed to the MRD to effectively shut the MRD bore aperture. Once the force is terminated the movable portion will attempt to move back to an opened configuration.

The term "connected" in reference to the shutting assembly parts and modules, interchangeably refers hereinafter to any contact, relation, association, integration, interconnection, joining, interweaving, placing, nesting, layering, etc., of the shutting assembly parts to each other and to a third party.

The term "transparent material" interchangeably refers hereinafter to materials such as, poly-methyl methacrylate, thermoplastic polyurethane, polyethylene, polyethylene terephthalate, isophthalic acid modified polyethylene terephthalate, glycol modified polyethylene terephthalate, polypropylene, polystyrene, acrylic, polyacetate, cellulose acetate, polycarbonate, nylon, glass, polyvinyl chloride, etc. Further at least a portion of this material may be imbedded with non transparent materials for means of strength and/or conductivity such as metallic wires. Further this material may be MRI safe material.

The term "equipment ends" refers hereinafter to any equipment that has a longitudinal axis with a distal end and a proximal end. This could be medical life support or monitoring equipment comprising tubes that are connected at their distal end to a patient and on their proximal end to the apparatus body.

The term "track", interchangeably refers hereinafter to such as a track, guide, path, groove, rail, line, route, duct, channel, passage, course, trail, lineament, lane, road, seam, length, axis, tract, pathway, course, highway, roadway, alley, artery, avenue, boulevard, clearing, cut, drag, thoroughfare, trajectory, walk, track way, belt, swath, glider, circuit, stretch, runway, caterpillar track, half-track, flat track, soft close track, pivoted sliding track, adjustable track, etc. Further this track maybe a physical or a virtual motion path along which the moveable portion is maneuvered.

The term "sliding mechanism", interchangeably refers hereinafter to a mechanism in which a body is movable in a sliding motion along a track. A portion of the movable body is mounted on, suspended from, inserted to, threaded to, interweaved with, integrated to, fitted to, following, etc. a track. In reference to a physical track, the connection of the moveable portion to the track is directly by geometrical shape fit of on part with the other and/or via a third element such as wheels, rack wheels, ball bearings, rollers, rolling discs, lubricant, location guide, belts, pulleys etc. In reference to a virtual motion track, the movable portion is connected to a sliding motion providing mechanism such as telescopic arms, folding arms, arms, angled arms, etc. connected at a pivotal point, allowing for sliding movement along a predefined virtual path. In addition this sliding mechanism may enable straight sliding, curved sliding, folding slide, sliding around a corner, rolling door sliding, etc.

The term "self-movement mechanism", interchangeably refers hereinafter to a mechanism such as counter weight system, spring mechanism, cable and spring assembly, pull relaying at least partly on the earth gravitational pull, etc. In addition this mechanism is configured so that when the stopping mechanism is released the moving part will move towards a resting position. Further in some embodiments this movement is maneuvered by additional elements aiming to control the speed, direction, power, end position of the slide.

The term "interlock mechanism" interchangeably refers hereinafter to a mechanism used to help prevent the shutting assembly from harming the handler, patient or damaging itself by stopping the reciprocal movement of the shutting assembly when a body is detected in the movement range.

The term "one step release mechanism" interchangeably refers hereinafter to a mechanism used in immediate need of extracting a patient from the MRD bore that allows in one step the dislocation of at least a portion of the shutting assembly providing access to the patient.

The term "emergency brake system" interchangeably refers hereinafter to a safety system designed to enable one step immediately arrest of movement. This may be triggered automatically by a means such as an interlock system, ferromagnetic detection system, sensor detection of pre-defined physical condition in MRD bore, etc., and\or manually by the handler, patient or both. Further this system is of a brake system, motion stopping mechanism and any combination thereof.

The term "brake system" interchangeably refers hereinafter to a system designed to stop motion. This brake system may use friction, pumping, electro-magnetic, electric, pneumatic, insertion element, and etc., principle of operation. The brake maybe of a type such as frictional brakes, shoe brakes, pad brakes, hydrodynamic brakes, band brake, solenoid brake, overrun brake, surge brake, disc brake, pumping brakes, drum brake, bicycle brake, dynamic brake, railway brake, regenerative brake, vehicle brake, Eddy current brake, electric friction brake, electromagnetic brake, friction-plate electromagnetic couplings, electronically controlled pneumatic brakes, etc. In addition the brake system may comprise a brake wear indicator, a brake booster, and a manual override mechanism.

The term "motion stopping mechanism" interchangeably refers hereinafter to a mechanism designed to bring the movement of at least a part of the moveable portion to a halt. This mechanism may be based on a mechanism such as a brake system, beaver-tail stop, Geneva stop, brake run system along the track, wheel clamp, chuck, clamp, band clamp, mandrel, etc.

The term "handler" interchangeably refers herein after to any person operating or using the shutting assembly such as medical personal, maintenance personal, chaperon, technician, user, fireman, rescue personal, etc.

The term "automatic" in respect to the movement of a part of the shutting assembly interchangeably refers herein after to a pre-defined movement having a predetermined start and end positions. Further this movement could be derived from an engine, pneumatic mechanism (compressed from the self-sliding movement downwards), hydraulic cylinder, a self-sliding movement etc.

The term "manual" in respect to the movement of a part of the shutting assembly interchangeably refers herein after to any application of force by the handler aimed at moving at least a part of the moving portion. This force is generated by an action such as pushing, pulling, lifting, levering, turning, twisting, hitting, lowering, etc.

The term "remote control mechanism" interchangeably refers herein after to a component used for operating the device wirelessly from a short line-of-sight distance. This may be operable by a means such as Bluetooth connectivity, motion sensor control, light sensor control, voice control, RF, infrared, ultrasonic, etc.

The term "ferromagnetic detecting device" interchangeably refers herein after to a system aimed for detection of metal or metal containing components. This system usually contains a detector, and a feedback element such as an audible alarm, visual indicator etc. This system is also able to transfer feedback to other devices such as the motion stopping mechanism, emergency brake, user interface, etc.

The term "value of n" interchangeably refers herein after to the numerical value of the ratio between the length (l) and the width (w) of the RFSC. l:w ratio is greater than a predefined value n; the value of n is selected from a group consisting of: $2.5<n<6$, $4<n<6$, $4<n<9$ and any combination thereof.

The term "user interface" interchangeably refers hereinafter to at least one defined area in which the user interacts with the shutting assembly. This area harbors elements such as: passage for medical equipment, display, CPU, alarm system, monitoring system, power supply, open mechanism, close mechanism, visual indicators, auditory indicators, sensible indicators, handles, etc. The user interface is designed for the handler, user or both.

The term "sensing equipment" interchangeably refers hereinafter to any device that receives a signal or stimulus (heat, pressure, light, motion, sound, humidity etc.) and responds to it in a distinctive manner.

The term "visual indicators" interchangeably refers hereinafter to a representation of light in the visible light range of about 380 nanometers to about 740 nm. More generally the terms refer to any light within the visible range that will be noticeable by the user of the invention (light, flashing light, flickering light, blinking light, change of spectrum of colors of light etc.).

The term "audible indicators" interchangeably refers hereinafter to a representation of sound, typically as an electrical voltage. Audible indicators have frequencies in the audio frequency range of roughly 20 to 20,000 Hz (the limits of human hearing). Audible indicators may be synthesized directly, or may originate at a transducer such as a microphone, musical instrument pickup, phonograph cartridge, or tape head.

The term "sensible indicators" interchangeably refers hereinafter to a physical movement of at least a portion of the user interface, which is noticeable to the user (shaking, vibrating, quivering, etc.).

The term "latching mechanism" interchangeably refers hereinafter to a mechanism such as: fastener, draw latch, latch, lock, belt, bolt, grip, bar, bond, clamp, clasp, connection, fixture, link, hook, hasp, buckle, brake, harness, clip, snap, pin, peg, grapnel, brake mechanism, pin insertion, etc., that is able to lock the position of the moving part in respect to the fixed part. This is achieved by means such as etc.

The term "module" interchangeably refers hereinafter to a structurally independent part, able to be connected and detached from the shutting assembly. This module is connected by itself or by another element in its contour, embedded, integrated, placed, interconnected, etc. to the incubator.

The term "user interface module" interchangeably refers hereinafter to a module that organizes at least one of the elements in which the handler or user interact with.

The term "ventilating module" interchangeably refers hereinafter to a module that circulates air and distributes it either evenly or in a defined direction. More specifically the term relates to a fan, a jet, a blower, a compressor, a pump, etc.

The term "thermo-regulating module" interchangeably refers hereinafter to a module that controls the temperature either by heating or by cooling or by doing both. More specifically the term relates to an air conditioned system, an infrared heater, a water/oil-heated radiator, a coiled heater, an open coil air heater, a round open coil air heater, a convection heater, straight or formed tubular heaters, a quartz tube air heater, a capacitor-type heater, a Pelletier module, etc.

The term "data analyzing module" interchangeably refers hereinafter to a module that controls and/or analyses data received from sensing equipment and transfers the data to a user interface or to third party equipment such as medical equipment, thermo-regulating module, ventilating module, etc. This module usually harbors a central processing unit (CPU).

The term "electromagnetic interference" interchangeably refers hereinafter to electromagnetic interference (EMI), and radio-frequency interference (RFI), derived from electromagnetic radiation, electromagnetic induction, magnetism, electrostatic fields etc., that affect any electrical circuit, or imaging device such as MRD, NMR, ESR, NQR, CT, US, etc. This interference is derived from any source natural or artificial such as earth magnetic field, atmospheric noise, moving masses of metal, electrical lines, subways, cellular communication equipment, electrical devices, TV and radio stations, elevators, etc. This interference may interrupt, obstruct, degrade, limit, result in false data, etc., the effective performance of the circuit or device.

The term "electromagnetic shielding" refers hereinafter to a practice or device aimed at reducing the electromagnetic field in a space by blocking the field with barriers made of conductive or magnetic materials. The shielding can reduce the effect of radio waves, electromagnetic fields and electrostatic fields. Shielding is typically applied to isolate devices from the external environment, and to cables to isolate wires from the environment through which the cable runs.

The term "magnetic shielding" refers hereinafter to a practice or device aimed at reducing the magnetic field in a space. This is usually achieved by applying high permeability and low coersivity metal alloys that draw the magnetic shield and contain it such as nickel containing alloys.

The term "active magnetic shielding" refers hereinafter to a practice or device aimed at actively reducing the magnetic field in a space. This is usually achieved by applying a field created by electromagnets to cancel out the ambient field within a volume. This system usually consists of maneuverable coils, magnetic field detectors, and feedback system.

The term "RF shielding" refers hereinafter to electromagnetic shielding that blocks radio frequency electromagnetic radiation.

The term "RF filter" interchangeably refers hereinafter to components designed to filter signals in the MHz to GHz frequency ranges. This frequency range is the range used by most broadcast radio, television, wireless communication. These components exert some kind of filtering on the signals transmitted or received. The filters could be active or passive such as waffle-iron filter, mechanical RF filter, etc. RF filters are usually placed when there is need to pass an electrical wire in or out of an MRD enclosure to ensure that the EMI does not couple on the conductive wiring. These filters could be of passive components such as a combination of inductors and capacitors.

The term "RF attenuation properties" interchangeably refers hereinafter to properties that do not allow passage though of defined RF waves. This could be achieved by means such as waveguides designed to attenuate RF, RF filters, etc.

The term "waveguide cutoff" interchangeably refers hereinafter to a boundary in a system's frequency response at which energy flowing through the system begins to be reduced, attenuated or reflected rather than passing through.

The term "cutoff frequency", (fc) interchangeably refers hereinafter to the frequency beyond which the waveguide no longer effectively contains EMI.

According to one embodiment of the present invention, a shutting assembly for a magnetic resonance imaging device (MRD) bore aperture, comprising at least one first movable portion and at least one second portion affixed to the MRD, wherein the shutting assembly further comprising a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD.

According to another embodiment of the invention, a shutting assembly as defined above is disclosed, comprising at least one motion stopping mechanism, wherein the motion stopping mechanism is interconnected to a portion selected from a group consisting of: within the MRD bore, the MRD external wall, at least one movable portion, at least one portion affixed to the MRD and any combination thereof.

According to another embodiment of the invention, a shutting assembly as defined above is disclosed, wherein the motion stopping mechanism is released by a means selected from a group consisting of: manual, automatic, remote control or any combination thereof. When the motion stopping mechanism is released self-movement of at least the movable portion is triggered.

According to another embodiment of the invention, a shutting assembly as defined above is disclosed, wherein the shutting assembly further comprising an emergency brake system; further wherein the emergency brake system immediately aborts the movement of at least one movable portion.

According to another embodiment of the invention, a shutting assembly as defined above is disclosed, wherein the emergency brake system is interconnected to a portion selected from a group consisting of: within the MRD bore, the MRD external wall, at least one movable portion, at least one portion affixed to the MRD and any combination thereof.

According to another embodiment of the invention, a shutting assembly as defined above is disclosed, wherein the latching mechanism is connected to at least a portion selected from a group consisting of: within the MRD bore, the MRD external wall, at least one movable portion, at least one portion affixed to the MRD and any combination thereof.

According to another embodiment of the invention, a shutting assembly as defined above is disclosed, wherein at least one affixed portion is connected to a portion selected from a group consisting of: within the MRD bore, the MRD external wall, at least one movable portion, the sliding mechanism and any combination thereof.

According to another embodiment of the invention, a shutting assembly as defined above is disclosed, wherein at least a part of one affixed portion is connected to the MRD external wall, in reference to the bore aperture, selected from a group consisting of: top, bottom, left side, right side, perpendicular to the floor, non-perpendicular to the floor, around at least a portion of the MRD aperture and any combination thereof.

According to another embodiment of the invention, a shutting assembly as defined above is disclosed, wherein at least a part of one moveable portion is connected to a portion selected from a group consisting of: within the MRD bore, the MRD external wall, at least one affixed portion, the sliding mechanism and any combination thereof.

According to another embodiment of the invention, a shutting assembly as defined above is disclosed, wherein the assembly additionally comprises an interlock mechanism.

According to another embodiment of the invention, a shutting assembly as defined above is disclosed, comprising an interlock mechanism, wherein the interlock mechanism includes an object detecting system thereby preventing the movable portion from colliding with undesired objects.

According to another embodiment of the invention, a shutting assembly as defined above is disclosed, wherein at least a portion of the shutting assembly comprises transparent material, enabling at least a portion of the patient to be viewed.

According to another embodiment of the invention, a shutting assembly as defined above is disclosed, wherein at least a portion of the assembly comprises electromagnetic conductive material.

According to another embodiment of the invention, a shutting assembly as defined above is disclosed, wherein at least a portion of the assembly comprises a material selected from a group consisting of: diamagnetic, paramagnetic, ferromagnetic materials and combination thereof.

According to another embodiment of the invention, a shutting assembly as defined above is disclosed, wherein at least a portion of the shutting assembly is constructed in layers.

According to another embodiment of the invention, a shutting assembly as defined above is disclosed, comprising a one-step release mechanism, wherein the mechanism enables quick access to the patient when in the MRD bore.

According to another embodiment of the invention, a shutting assembly as defined above is disclosed, wherein the shutting assembly further comprises a ferromagnetic material detecting device; further wherein the detecting device comprises an indicator selected from a group consisting of: auditable alarm, visual alarm, sensible alarm and any combination thereof. When this system detects a ferromagnetic object, the indicator will be operated, and in some embodiments the shutting mechanism will cover the MRD bore.

According to another embodiment of the invention, a shutting assembly as defined above is disclosed, comprising ports, wherein the ports are configured to allow installing of modules selected from a group of: thermo-regulating, ventilating, data analyzing, viewing, monitoring, medical equipment, user interface, active magnetic shielding, ferromagnetic detecting device, and any combination thereof.

According to another embodiment of the invention, a shutting assembly as defined above is disclosed, wherein the shutting assembly further comprising a user interface connected to equipment selected from a group consisting of: sensing, viewing, data analyzing, medical, monitoring, ferromagnetic materials detecting, magnetic field detecting, indicators and any combination thereof.

According to another embodiment of the invention, a shutting assembly as defined above is disclosed, further comprising at least one RF filter, wherein the RF filter is connected to a portion selected from a group consisting of: the shutting assembly moveable portion, the shutting assembly portion affixed to the MRD, the MRD and any combination thereof, thereby enabling RF shielded passage of electrical wiring from the external environment to inner space of the MDR bore.

According to another embodiment of the invention, a shutting assembly as defined above is disclosed, wherein at least a portion of the shutting assembly closed a conductive circuit with at least a portion of the MRD.

According to another embodiment of the invention, a shutting assembly as defined above is disclosed, wherein a moving portion may be represented by a panel, lid, shutter, door, leaf, sheet, bars, etc.

According to another embodiment of the invention, a shutting assembly as defined above is disclosed, comprising a sliding mechanism wherein the sliding mechanism is able to employ self-movement along a defined track using a force such as the earth gravitational pull, spring mechanism, hydraulic pressure mechanism, etc., and to be manually or automatically pushed back.

According to another embodiment of the invention, a shutting assembly as defined above is disclosed, wherein a normally closed mechanism requires the application of direct or indirect force in order to open the shutting assembly by uncovering the MRD bore.

According to another embodiment of the invention, a shutting assembly as defined above is disclosed, wherein a normally opened mechanism requires the application of direct or indirect force in order to close the shutting assembly by covering the proximal aperture of the MRD bore.

According to another embodiment of the invention, a shutting assembly as defined above is disclosed, wherein the movement of the movable portion allows the aperture of the MRD bore to be completely covered by the shutting assembly.

According to another embodiment of the invention, a shutting assembly as defined above is disclosed, wherein movement of the at least one moveable portion relative to at least one portion affixed to the MRD is achieved by means selected from a group consisting of: manual, automatic, self or any combination thereof.

According to another embodiment of the current invention, a shutting assembly as defined above is disclosed, comprising an engine utilized to move at least a portion of the shutting assembly to an open or closed position. Further this engine is powered from internally supplied DC, externally supplied AC or DC or both. In addition this engine has a manual override configuration.

According to another embodiment of the invention, a shutting assembly as defined above is disclosed wherein the fixed positioned portion comprises a plurality of parts including tracks, support elements, sliding mechanism, latch mechanism, etc.

According to another embodiment of the invention, a shutting assembly as defined above is disclosed comprising at least one latching mechanism thereby enabling securing of the position of the moving part, maintaining a closed or opened configuration of the shutting assembly.

According to another embodiment of the invention, a shutting assembly as defined above is disclosed, where at least a portion of the shutting assembly is made of high endurance to impact materials. Such materials may be composed from metal, metal alloys, composite materials and combination thereof. These composites may be such as GFRP (glass-fiber reinforced plastic) and CFRP (carbon-fiber reinforced plastic).

According to another embodiment of the invention, a shutting assembly as defined above is disclosed, where at least a portion of the shutting assembly is constructed in a geometrical design aimed at high endurance to impact from the external environment towards the inner space of the MRD bore.

According to another embodiment of the invention, a shutting assembly as defined above is disclosed, wherein the shutting assembly acts as a passive electromagnetic shield. In order to create an effective non-active magnetic shielding at least a portion of the shutting assembly may be built from magnetic alloys with high permeability and low coercivity such as Permalloy, and different types of Mu-metal. These could be built of materials such as metal sheet, metal casting, metal screen, metal containing foam, metallic ink and any combination thereof.

According to another embodiment of invention, a shutting assembly as defined above is disclosed, comprising magnetic field detectors, maneuverable coils and feedback system wherein these elements are connected to the shutting assembly. In order to supply an effective active magnetic shield coils with suitable currents that generate an opposite field are needed. In every point of the shielded area, the field of the active shield is opposite to the original stray field so that they cancel each other. Both the coil positions and the currents in the coils must be calculated accurately in order to "destroy" the field in the whole shielded area.

According to another embodiment of the invention, a shutting assembly as defined above is disclosed, wherein the at least a portion of the shutting assembly and the outer structure of the MRD it is connected to, form a conductive circuit. This could be formed with the existing MRD or with another element surrounding the MRD. This arrangement will serve as an RF shield. Further wherein the shutting assembly and the surrounding elements are typically made of metal such as copper, galvanized steel, aluminum, etc.

According to another embodiment of the invention, a shutting assembly as defined above is disclosed, comprising at least a portion of a semi permeable barrier, wherein the barrier is structured like a mesh, web, net, bars, grid, rack, etc. This will maintain air circulation, light penetration, and view from within MDR bore also when shutting assembly is in a closed configuration. These structures can be made by manufacturing at least a portion of the shutting assembly from fibers, nets, rods, of metal or composite materials. Further wherein these grids may be configured to act as waveguides with a cutoff frequency of up to 1 GHz.

According to another embodiment of the invention, a shutting assembly as defined above is disclosed, comprising holes made in a conductive portion of the shutting assembly, wherein these holes are defined by means of size and shape to act as waveguides with a cutoff frequency of 0-1000 MHz, 0-500 MHz, 0-200 MHz, or the like as needed to meet the frequency of a specific MRD. These holes in the shutting assembly are made to allow ventilation and light penetration in an otherwise closed space.

According to another embodiment of the current invention, a shutting assembly as defined above is disclosed, comprising magnetic shielding, RF shielding and physical shielding. When the moving body is in place and the entrance of the MRI bore is completely covered the EMI from outside cannot penetrate through the shutting assembly and distort MRI scan. Furthermore the moving part in a closed configuration protects the electrical circuits of equipment outside the MRD from electromagnetic interference. Furthermore once the moving body is in closed configuration it protects the inner space of the MRD bore from pulled ferromagnetic objects attracted by the magnetic field of the MRD. In some embodiments the shutting assembly may contain the magnetic shield within.

According to another embodiment of the invention, a shutting assembly as defined above is disclosed, comprising handles, wherein the handles are connected to the shutting assembly. These handles are such as handle, lever, wheel, knob, stars, hafts, stem, arm, bail, crank, ear, grasp, haft, hand, grip, helve, hilt, hold, holder, bar, pull handle, twist handle, door handle etc.

According to another embodiment of the invention, a shutting assembly as defined above is disclosed wherein the moving part is comprised of connected panels that construct a rolling door.

According to another embodiment of the invention, a shutting assembly as defined above is disclosed, further comprising an RF filter connected to at least a portion of shutting assembly, thereby enabling the transfer of conductive wires within such a for lighting, voice transmission etc.

According to another embodiment of the invention, a shutting assembly as defined above is disclosed further comprising a plurality of support elements further supporting the position of the moving body. These elements are connected to a location selected from a group consisting of: the MRD, the slide track, the fixed part, the moving part, and any combination thereof.

According to another embodiment of the invention, a shutting assembly as defined above is disclosed, comprising a fixed structure, attached around the open entrance, configured to secure the moving body when the moving body completely covers the open entrance. The fixed structure may be represented by a frame with a latching mechanism.

According to another embodiment of the invention, a shutting assembly as defined above is disclosed, comprising a latching mechanism. In some embodiments the latching mechanism is connected to a portion selected from a group consisting of: the shutting assembly, on the MRD, in the MRD bore, on a moving part of shutting assembly, on a fixed part of the shutting assembly and any combination thereof.

According to another embodiment of the invention, a shutting assembly as defined above is disclosed, comprising an interlock system. This system includes an object detecting system that prevents the panel from closing on objects or people. This detection could be based on a means such as a passive infrared detector, a movement detector, a weight detector etc. When this system detects an object in its path, the movement of the moveable portion is stopped by an emergency brake, motion stopping mechanism, latching mechanism or any combination thereof.

According to another embodiment of the invention the physical conditions inside the MRD bore are determined by various systems such as a thermo-regulating, sound attenuating, ventilating, lighting, etc. These systems may be integrated to the shutting assembly or designed to fit specific ports within the shutting assembly.

According to another embodiment of the invention, a shutting assembly as defined above is disclosed, where the physical conditions inside the MRD bore are monitored by sensors placed at least partly on the closure assembly. Further these sensors may be connected to a CPU and a user interface. The sensors are sensing a physical quality selected from a group of: temperature, humidity, gas concentration, location of the moveable portion of the shutting assembly and any combination thereof.

According to another embodiment of the invention, a shutting assembly as defined above is disclosed, comprising at least one conduit, wherein the conduit has RF attenuation properties. These attenuation properties are reached by constructing the conduit as a waveguide whereas the RF is below the waveguide cutoff. Further an RF filter can be installed defined to block RF of defined range. An RF filter would provide protection to electrical power, data cables, etc.

According to another embodiment of the current invention a shutting assembly as defined above is disclosed, comprising at least one conduit, the conduit is characterized by a length (l) and width (w), l:w ratio is greater than a predefined value n wherein the value of n is selected from a group consisting of: 2.5<n<6, 4<n<6, 4<n<9 and any combination thereof, thereby providing RF shielding.

According to another embodiment of the invention, a shutting assembly as defined above is disclosed, comprising at least one conduit, wherein the conduit harbors a space large enough and accessible to place a plurality of tubing. This tubing may be held in place by clips, anchors, designated placements, etc. All tubing may be placed together or each in a designated location that may be labeled, thereby easing the location of a specific tube or cable According to another embodiment of the invention, a shutting assembly as defined above is disclosed, wherein the conduit has at least one telescopic wall or hinged wall that may change the inner volume of the conduit to fit different needs as long as the ratio of length (l) and width (w), l:w ratio is greater than a predefined value n.

According to another embodiment of the invention, a shutting assembly as defined above is disclosed, wherein at least a portion of the conduit is made of electromagnetic conductive material.

According to another embodiment of the invention, a shutting assembly as defined above is disclosed, wherein at least a portion of the conduit is shaped to accommodate at least a portion of medical equipment devices, medical equipment tubing, or both, within.

According to another embodiment of the invention, a shutting assembly as defined above is disclosed, wherein the RFSC is interconnected to a portion selected from a group consisting of: the shutting assembly movable portion, the shutting assembly portion affixed to MRD, MRD and any combination thereof.

According to another embodiment of the invention, a shutting assembly as defined above is disclosed, wherein the conduit is interconnected to the shutting assembly at least a portion of the perimeter between the shutting assembly and the MRD bore aperture.

According to another embodiment of the invention, a shutting assembly as defined above is disclosed, wherein the conduit comprises an open face toward the MRD external environment, along its longitudinal axis, thereby enabling removal of medical equipment, without detaching it from any of the equipment ends.

According to another embodiment of the invention, a shutting assembly as defined above is disclosed, wherein the conduit is configured to attenuate electromagnetic interference by means such as connected waveguide, the actual conduit designed as a waveguide, RF filter, waveguide filter, attenuating material, conductive material, etc.

According to another embodiment of the invention, a shutting assembly as defined above is disclosed, wherein the conduit is configured by means of shape, size and material to attenuate the passage of frequencies such as 0-1000 MHz, 0-500 MHz, 0-200 MHz, any frequency defined by the MRD manufacturer, etc.

According to another embodiment of the invention, a shutting assembly as defined above is disclosed, wherein the conduit profile is of a shape selected from a group consisting of: cylindrical, polygonal, symmetrical, non-symmetrical and any combination thereof.

According to another embodiment of the invention, a shutting assembly as defined above is disclosed, wherein the conduit length is of a shape selected from a group consisting of: curved, straight, polygonal, symmetrical, non-symmetrical and any combination thereof.

According to another embodiment of the invention, a shutting assembly as defined above is disclosed, further comprising at least one RF filter, wherein the RF filter is connected to at least a portion of the conduit, thereby enabling RF shielded passage of wiring from the external environment to inner space of the MDR bore.

According to another embodiment of the invention, a shutting assembly as defined above is disclosed, wherein the conduit is shaped to permit passage within of tubing of a plurality of shapes and sizes.

According to another embodiment of the invention, a shutting assembly as defined above is disclosed, wherein the conduit further comprises at least one tubing holder selected from a group consisting of: clip, anchor, concave placement, grip, clasp, clamp, strip, belt, catch, snap, fastener, hook, hold, support, buckle, latch, lock, hasp, harness, affixer, binder, joiner, band, ring, string, tie, link, chain and any combination thereof.

According to another embodiment of the invention, a shutting assembly as defined above is disclosed, wherein at least a portion of the conduit aperture edge comprises a curved profile.

According to another embodiment of the invention, a shutting assembly as defined above is disclosed, wherein at least a portion of the conduit walls edge profiles are of a smoothed finish. A smoothed finish allows for less friction to be employed on the tubing, thereby minimizing rapture and maximizing ease of handling.

According to another embodiment of the invention, a shutting assembly as defined above is disclosed, wherein at least a portion of the conduit is perforated, further wherein the perforations are of a length and diameter configured as a waveguide RF attenuator, thereby allowing for RF shielding together with light and air penetration into the MRD.

According to another embodiment of the invention, a shutting assembly as defined above is disclosed, wherein the conduit is constructed as a detachable module, thereby allowing moving the patient connected to medical equipment to another location that has a port for this module such as a stretcher, gurney, bed, operating table, etc.

Reference is now made to FIG. 1A schematically illustrating, in an out of scale manner, an embodiment of the invention. An exemplary illustration of an open configuration of the shutting assembly for an open entrance (600) of a closed bore MRD (800), wherein the shutting assembly comprises a moving body (100) equipped with a handle (111), and a fixed body (140) holding two tracks placed on either side of the MRD bore. The moving body is mounted on the two tracks enabling its movement vertically upwards and downwards. Additionally the shutting assembly comprises a conduit (160) for passing life support tubing and monitors' sensors from the outer side of the MRD into the inner side of the MRD. In some embodiments of the present invention a moving body is represented by body such as a panel, lid, shutter, door, leaf, semi permeable web, bars, etc. (100). Further in some embodiments of the present invention the moving body is designed in a shape such as round, polygonal, compound shape, symmetrical, non-symmetrical etc.

Figure 1B:
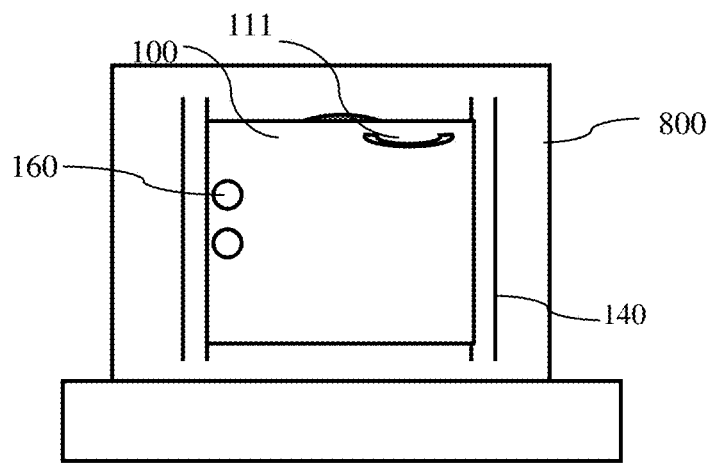
FIG. 1B is a schematic illustration of an embodiment of the present invention illustrating a shutting assembly for an entrance of a closed bore MRI scanner in its closed configuration.

Reference is now made to FIG. 1B schematically illustrating, in an out of scale manner, an embodiment of the invention. An exemplary illustration of a closed configuration of the shutting assembly for an open entrance (600) of a closed bore MRD (800), wherein the moving part (100) in a rectangular embodiment completely covers the MRD aperture.

Figure 2A:
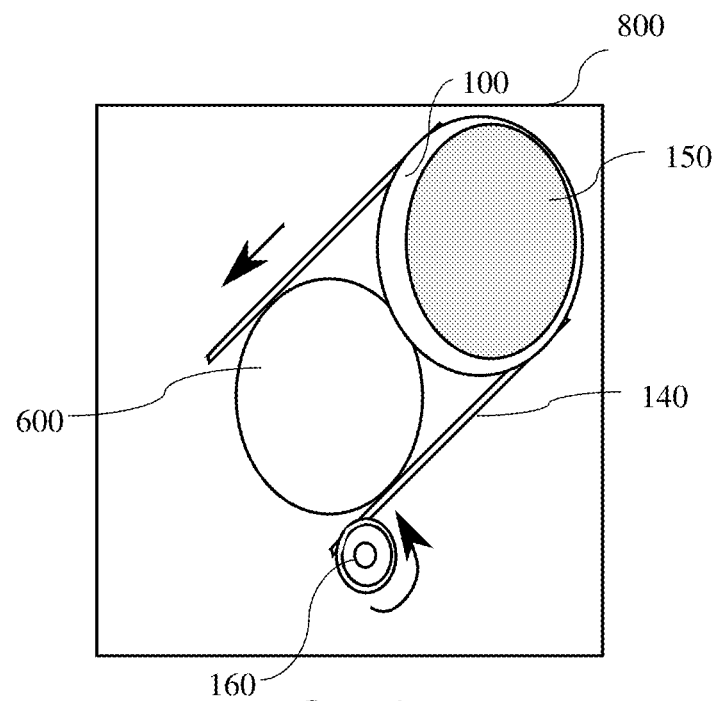
FIG. 2A is a schematic illustration of an embodiment of the present invention illustrating a shutting assembly in a circular embodiment for an entrance of a closed bore MRI scanner in its opened configuration with angled sliding tracks.

Reference is now made to FIG. 2A schematically illustrating, in an out of scale manner, an embodiment of the invention. The shutting assembly in an open configuration installed on an MRD (800) aperture (600). The moving body (100) in a circular embodiment, harboring a transparent portion (150), is enabling a view of at least a portion of the patient. The fix positioned part comprising of two elements (140) on either side of the MRD aperture. These fix positioned parts are attached in non-perpendicular angle towards the floor. In addition in some embodiments a manual lever wheel handle is connected to the fixed positioned part that enables sliding of the moving part reciprocally to the aperture.

Figure 2B:
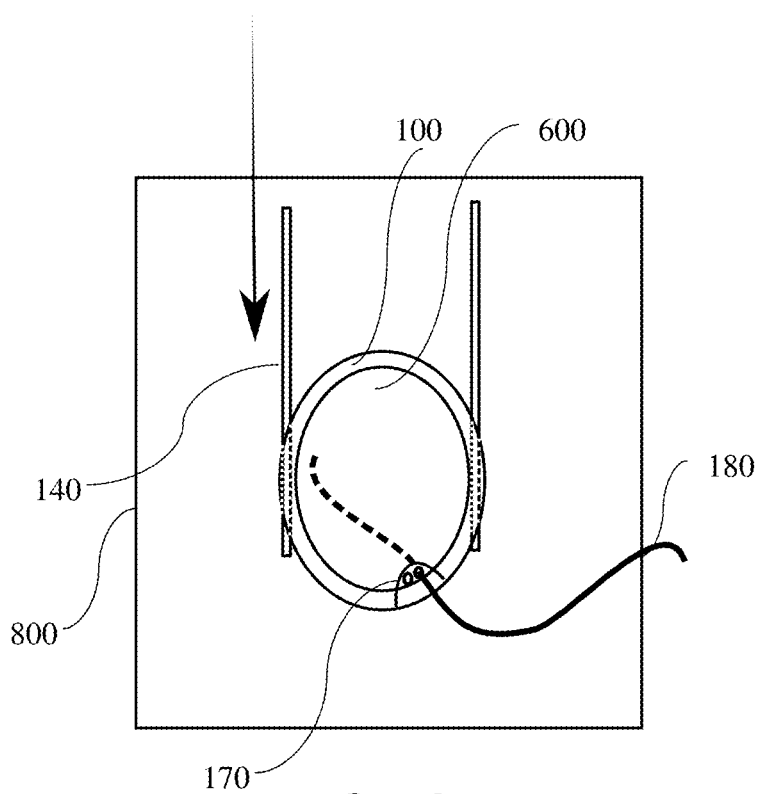
FIG. 2B is a schematic illustration of an embodiment of the present invention illustrating a shutting assembly in a circular embodiment for an entrance of a closed bore MRI scanner in its closed configuration with including a conduit for passing medical equipment.

Reference is now made to FIG. 2B schematically illustrating, in an out of scale manner, an embodiment of the invention. The shutting assembly in a closed configuration installed on an MRD (800) aperture (600). The moving body (100), in a circular embodiment, harboring a conduit (170) adapted for the passing of an exemplary tube (180). The fixed position part comprises two perpendicularly placed sliding tracks (140) on either side of the aperture.

Figure 3A:
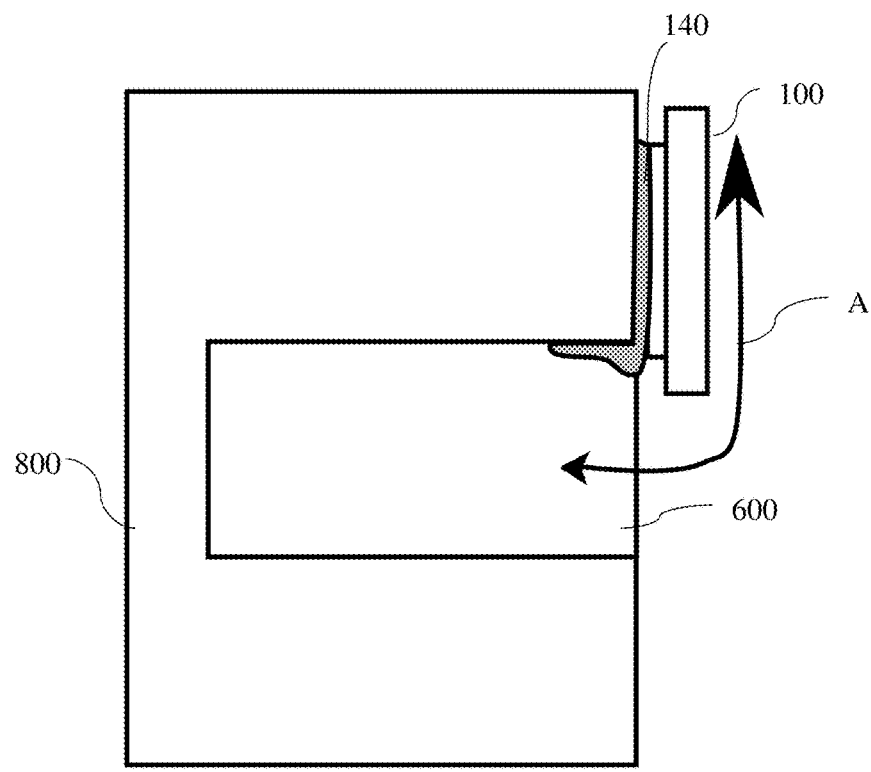
FIG. 3A is a schematic illustration of an embodiment of the present invention illustrating a side view of a circular embodiment of the shutting assembly in an open configuration where the slide tracking element is connected to the top of the MRD aperture and within.

Reference is now made to FIG. 3A schematically illustrating, in an out of scale manner, an embodiment of the invention. The shutting assembly in a side view illustrating the MRD (800) and MRD bore (600) and the shutting assembly in an open configuration. The fixed positioned part comprises a sliding track from above the aperture to within the aperture; the moving part (100) is able to slide vertically down and around the aperture corner to hermetically seal the MRD aperture.

Figure 3B:
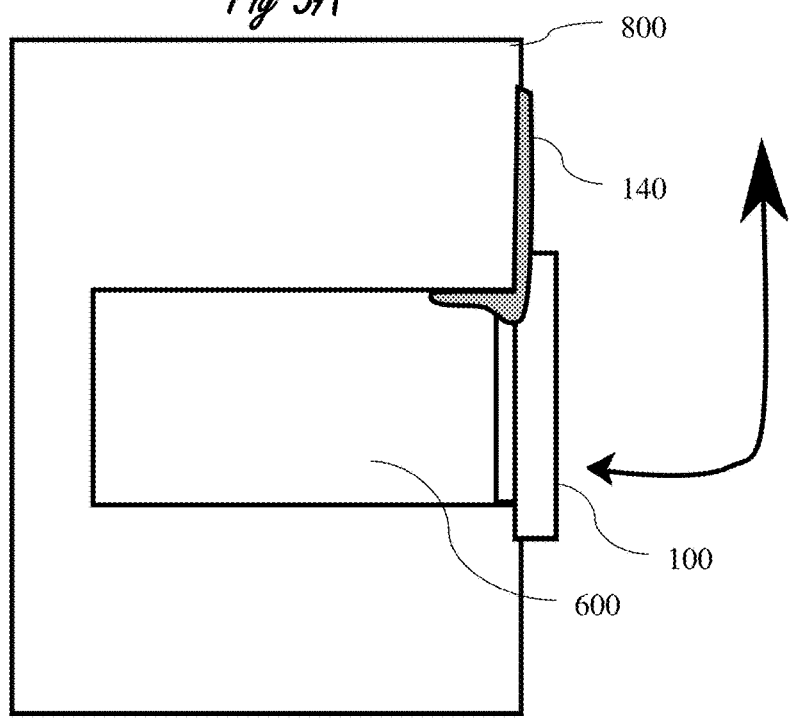
FIG. 3B is a schematic illustration of an embodiment of the present invention illustrating a side view of a circular embodiment of the shutting assembly in a closed configuration where the slide tracking element is connected to the top of the MRD aperture and within.

Reference is now made to FIG. 3B schematically illustrating, in an out of scale manner, an embodiment of the invention. The shutting assembly in a side view illustrating the MRD (800) and MRD bore (600) and the shutting assembly in a closed configuration. The fixed positioned part comprises a sliding track from above the aperture to within the aperture; the moving part (100) is able to slide vertically down and around the aperture corner to hermetically seal the MRD aperture.

Figure 4A:
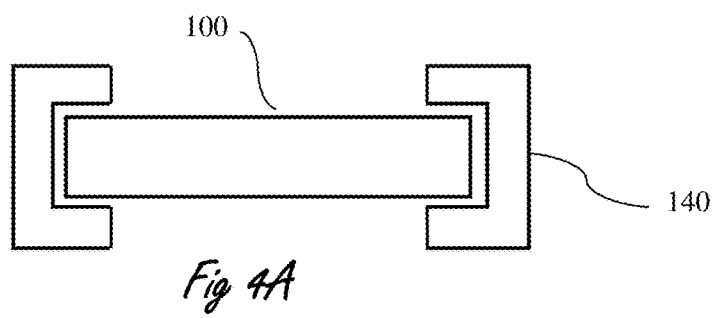
FIG. 4 A-C are schematic illustrations of embodiments of the present invention illustrating a top view of spatial relationships between a moving body and a fixed body.
Figure 4B:
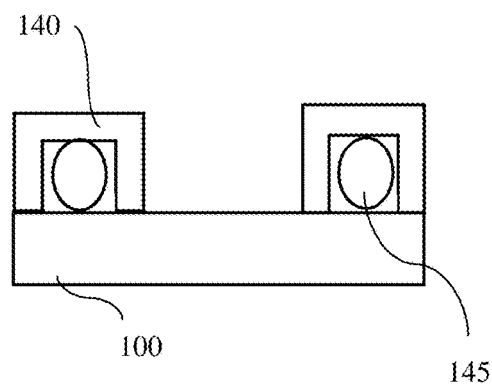
Figure 4C:
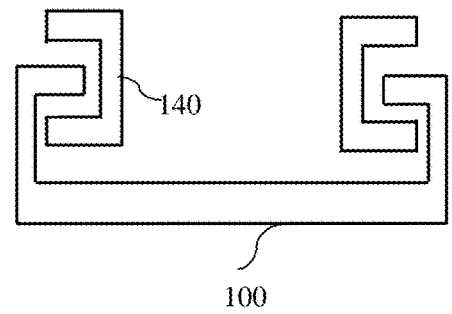

Reference is now made to FIG. 4A-C schematically illustrating, in an out of scale manner, embodiments of the invention. The shutting assembly, from a top view, illustrating some of the embodiments of the spatial relationship between the moving part and the fixed position part. FIG. 4A illustrates the moving part (100) situated inside the fixed positioned part (140). FIG. 4B illustrates the moving part enveloping the fixed part (140). FIG. 4C illustrates a moving part partly enclosed by the fixed position parts (140)

Figure 5A:
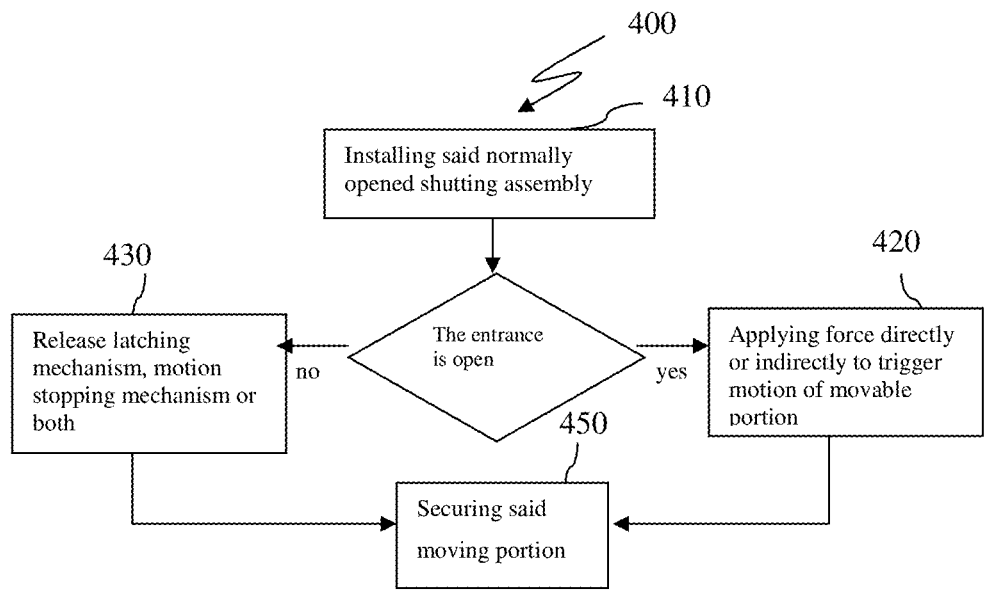
FIG. 5A is a schematic diagram of a method of the current invention describing a block diagram for operating of the normally opened shutting assembly.

Reference is now made to FIG. 5A schematically illustrating a method for operating the normally opened shutting assembly in a block diagram (400). The first step is installing the shutting assembly useful for shutting the open entrance of the MRD (410). If the entrance is opened (420) then a force is applied to move the movable portion to cover the MRD bore. If the entrance is closed (430) then the latching mechanism, stopping mechanism or both, are released triggering the self-movement of the moveable portion so the MRD bore is not covered. This location is further secured by a latching mechanism (450).

Figure 5B:
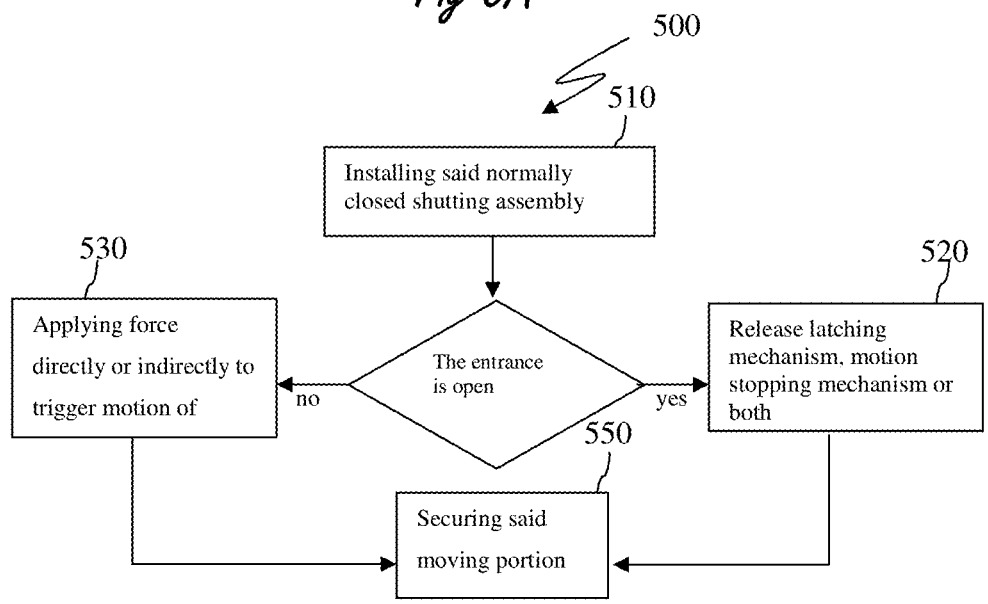
FIG. 5B is a schematic diagram of a method of the current invention describing a block diagram for operating of the normally closed shutting assembly.

Reference is now made to FIG. 5B schematically illustrating a method for operating the normally closed shutting assembly in a block diagram (500). The first step is installing the shutting assembly useful for shutting the open entrance of the MRD (510). If the entrance is opened (520) then the latching mechanism, stopping mechanism or both, are released triggering the self-movement of the moveable portion so the MRD bore is covered. If the entrance is covered (530) then a force is applied to move the movable portion to uncover the MRD bore. This location is further secured by a latching mechanism (550).

Figure 6:
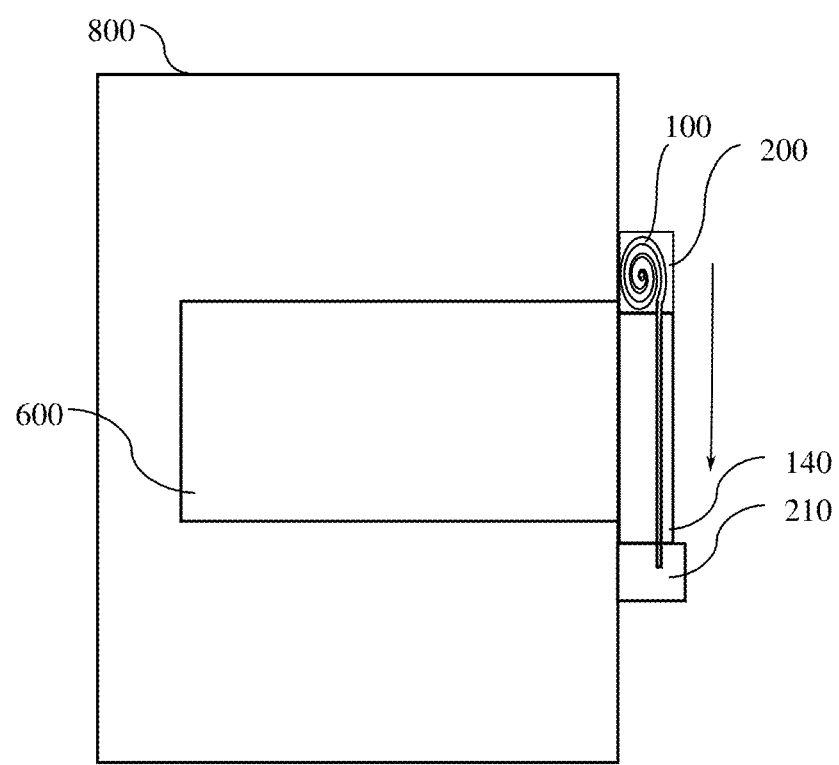
FIG. 6 is a schematic illustration of an embodiment of the present invention illustrating a side view of the shutting assembly in a closed configuration. The moving part comprises connected panels rolled together to form a rolling door.

Reference is now made to FIG. 6 schematically illustrating, in an out of scale manner, an embodiment of the invention. The shutting assembly in a side view connected to the MRD (800) covering the MRD bore (600). In this embodiment the moving part comprises panels connected to form a rolling sheet (100) that is rolled down along a sliding track embedded in a part (140) that is fixed to the MRD. In addition this moving part is guided by support elements (200, 210) fixed to the MRD further harboring latching mechanisms to secure open and closed configuration of the shutting assembly.

Figures 7A, 7B:
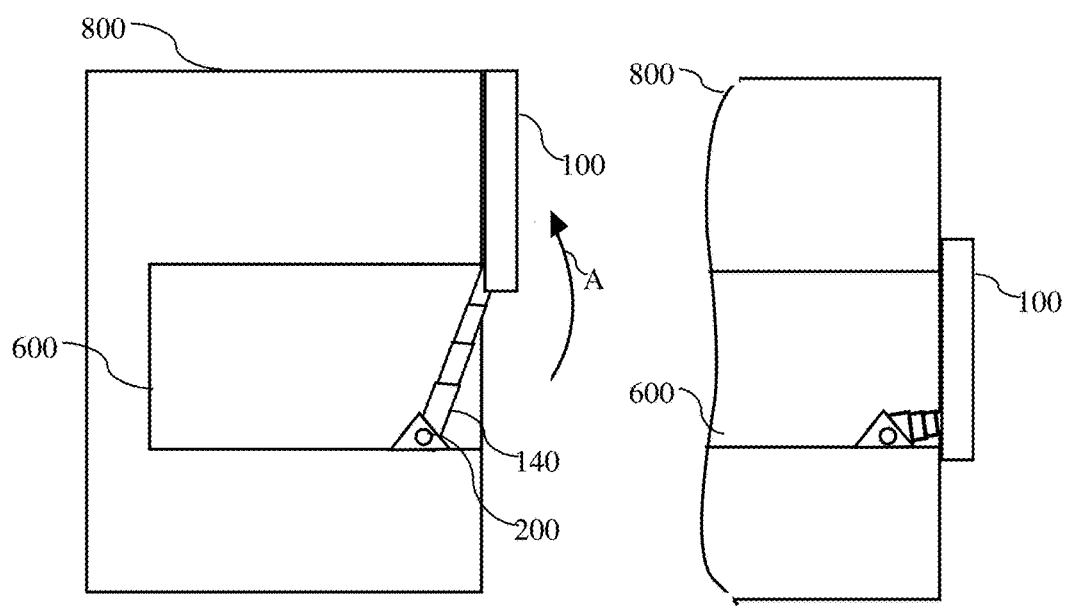
FIG. 7A is a schematic illustration of an embodiment of the present invention illustrating a side view of the shutting assembly in an opened configuration. The sliding mechanism in this embodiment comprises cylindered telescopic arms.
FIG. 7B is a schematic illustration of an embodiment of the present invention illustrating a side view of the shutting assembly in a closed configuration. The sliding mechanism in this embodiment comprises cylindered telescopic arms.

Reference is now made to FIG. 7A schematically illustrating, in an out of scale manner, an embodiment of the invention. The shutting assembly in a side view connected to the MRD (800), the sliding mechanism comprising of telescopic cylindered arms (140). In this embodiment the arms are connected to within the MRD bore (600). In other embodiments the arms may be connected by at least a portion to within the MRD bore on the top, left side, right side, bottom, the MRD external wall any combination thereof. Further these arms may be connected by at least a portion on the MRD external wall in reference to MRD aperture to the top, bottom, right side, left side and any combination thereof. These arms operate on a mechanism such as spring, counter weight, hydraulic mechanism, oil pressure mechanism, etc. Arrow A schematically illustrates in an out of scale manner the direction of movement of the moveable portion of the shutting assembly in order to cover and uncover the aperture of the MRD bore.

Reference is now made to FIG. 7B schematically illustrating, in an out of scale manner, an embodiment of the invention. The shutting assembly in a side view connected to the MRD (800), the sliding mechanism comprising of telescopic cylindered arms (140). In this illustration the shutting mechanism is in a configuration where the MRD bore (600) is uncovered.

According to another embodiment of the invention, a method for physically shielding an MRD from pulled ferromagnetic objects is disclosed, by providing a shutting assembly comprising at least one first movable portion and at least one second portion affixed to the MRD, comprising steps of: (a) obtaining an MRD and the shutting assembly; (b) installing the shutting assembly to the MRD; (c) inserting patient into the MRD bore; (d) moving the moveable portion such as to cover the MRD bore; and (e) imaging patient; wherein the shutting assembly further comprising a normally closed or normally open sliding mechanism, further wherein the sliding mechanism couples at least one first moveable portion to at least one second portion affixed to the MRD.

According to another embodiment of the invention, a method as defined above is disclosed, additionally comprising a step of arranging the shutting assembly such that when it is placed over the MRD bore, the aperture of the MRD bore is completely covered by the shutting assembly.

According to another embodiment of the invention, a method as defined above is disclosed, wherein the normally closed sliding mechanism retains the MRD bore aperture covered by the shutting assembly, when not applying force directly or indirectly to at least one movable portion.

According to another embodiment of the invention, a method as defined above is disclosed, wherein the normally opened sliding mechanism retains the MRD bore aperture uncovered by the shutting assembly, when not applying force directly or indirectly to at least one movable portion.

According to another embodiment of the invention, a method as defined above is disclosed, wherein self-movement of at least one moveable portion relative to at least one portion affixed to the MRD enables the MRD bore aperture to be covered or uncovered.

According to another embodiment of the invention, a method as defined above is disclosed, additionally comprising a step of force triggering the movement of at least one moveable portion relative to at least one portion affixed to the MRD enabling the MRD bore aperture to be covered or uncovered; further wherein the force is applied directly, indirectly or both.

According to another embodiment of the invention, a method as defined above is disclosed, additionally comprising a step of moving the at least one moveable portion relative to the at least one portion affixed to the MRD is by means selected from a group consisting of: manual, automatic, self or any combination thereof.

According to another embodiment of the invention, a method as defined above is disclosed, additionally comprising a step of interconnecting a motion stopping mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of releasing the motion stopping mechanism is by a means selected from a group consisting of: manual, automatic, remote control or any combination thereof.

According to another embodiment of the invention, a method as defined above is disclosed, wherein the shutting assembly further comprising an emergency brake system; further wherein the emergency brake system immediately aborts the movement of at least one movable portion.

According to another embodiment of the invention, a method as defined above is disclosed, additionally comprising a step of interconnecting the emergency brake system to a portion selected from a group consisting of: within the MRD bore, the MRD external wall, at least one movable portion, at least one portion affixed to the MRD and any combination thereof.

According to another embodiment of the invention, a method as defined above is disclosed, wherein the shutting assembly further comprising a latching mechanism; further wherein the latching mechanism secures the location of at least one movable portion with respect to at least one second portion affixed to the MRD.

According to another embodiment of the invention, a method as defined above is disclosed, additionally comprising a step of connecting the latching mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of connecting at least one affixed portion to a portion selected from a group consisting of: within the MRD bore, the MRD external wall, at least one movable portion, the sliding mechanism and any combination thereof.

According to another embodiment of the invention, a method as defined above is disclosed, additionally comprising a step of connecting at least a part of one affixed portion to the MRD external wall, in reference to the bore aperture, selected from a group consisting of: top, bottom, left side, right side, perpendicular to the floor, non-perpendicular to the floor, around at least a portion of the MRD aperture and any combination thereof.

According to another embodiment of the invention, a method as defined above is disclosed, additionally comprising a step of connecting at least a part of one moveable portion to a portion selected from a group consisting of: within the MRD bore, the MRD external wall, at least one affixed portion, the sliding mechanism and any combination thereof.

According to another embodiment of the invention, a method as defined above is disclosed, wherein the shutting assembly additionally comprises an interlock mechanism.

According to another embodiment of the invention, a method as defined above is disclosed, additionally comprising a step of including, an object detecting system to the interlock mechanism, thereby preventing the movable portion from colliding with undesired objects.

According to another embodiment of the invention, a method as defined above is disclosed, wherein at least a portion of the assembly comprises shielding selected from a group consisting of: magnetic shielding, RF shielding, physical shielding and any combination thereof.

According to another embodiment of the invention, a method as defined above is disclosed, wherein at least a portion of the assembly comprising active magnetic shielding, passive magnetic shielding or both.

According to another embodiment of the invention, a method as defined above is disclosed, additionally comprising a step of forming at least a portion of the shutting assembly comprising transparent material.

According to another embodiment of the invention, a method as defined above is disclosed, additionally comprising a step of forming at least a portion of the shutting assembly is a semi-permeable barrier.

According to another embodiment of the invention, a method as defined above is disclosed, additionally comprising a step of forming at least a portion of the assembly comprising electromagnetic conductive material.

According to another embodiment of the invention, a method as defined above is disclosed, additionally comprising a step of forming at least a portion of the assembly comprising a material selected from a group consisting of: diamagnetic, paramagnetic, ferromagnetic materials and combination thereof.

According to another embodiment of the invention, a method as defined above is disclosed, additionally comprising a step of constructing at least a portion of the shutting assembly in layers.

According to another embodiment of the invention, a method as defined above is disclosed, additionally comprising a step of forming the first movable portion is of a shape selected from a group consisting of: round, polygonal, compound, symmetrical, non-symmetrical and any combination thereof.

According to another embodiment of the invention, a method as defined above is disclosed, additionally comprising a step of enabling quick access to the patient by a one-step release mechanism when in the MRD bore.

According to another embodiment of the invention, a method as defined above is disclosed, additionally comprising a step of connecting a thermo-regulating system, thereby regulating the air temperature within the MRD bore.

According to another embodiment of the invention, a method as defined above is disclosed, additionally comprising a step of connecting a ventilating system, thereby ventilating the inner volume of the MRD bore.

It is another object of the current invention to disclose a method as described above, additionally comprising a step of attenuating sound at least a portion of the shutting assembly by means selected from a group consisting of: layered construct, sound absorptive material, sound isolating connections and any combination thereof.

According to another embodiment of the invention, a method as defined above is disclosed, additionally comprising a step of connecting sensing equipment sensing a physical quality selected from a group of: temperature, humidity, gas concentration, location of the moveable portion of the shutting assembly and any combination thereof.

According to another embodiment of the invention, a method as defined above is disclosed, additionally comprising a step of connecting viewing equipment enabling view of least a portion of the patient.

According to another embodiment of the invention, a method as defined above is disclosed, additionally comprising a step of connecting magnetic field detectors, maneuverable coils and feedback system to the shutting assembly.

According to another embodiment of the invention, a method as defined above is disclosed, additionally comprising a step of connecting a ferromagnetic materials detecting device; further wherein the detecting device comprises an indicator selected from a group consisting of: auditable alarm, visual alarm, sensible alarm and any combination thereof.

According to another embodiment of the invention, a method as defined above is disclosed, additionally comprising a step of forming ports, wherein the ports are configured to allow installing of modules selected from a group of: thermo-regulating, ventilating, data analyzing, viewing, monitoring, medical equipment, user interface, active magnetic shielding, ferromagnetic detecting device, and any combination thereof.

According to another embodiment of the invention, a method as defined above is disclosed, additionally comprising a step of connecting a user interface connected to equipment selected from a group consisting of: sensing, viewing, data analyzing, medical, monitoring, ferromagnetic materials detecting, magnetic field detecting, indicators and any combination thereof.

According to another embodiment of the invention, a method as defined above is disclosed, additionally comprising a step of connecting at least one RF filter, wherein the RF filter is connected to a portion selected from a group consisting of: the shutting assembly moveable portion, the shutting assembly portion affixed to the MRD, the MRD and any combination thereof, thereby enabling RF shielded passage of electrical wiring from the external environment to inner space of the MDR bore.

According to another embodiment of the invention, a method as defined above is disclosed, additionally comprising a step of closing at least a portion of the shutting assembly in a conductive circuit with at least a portion of the MRD.

According to another embodiment of the invention, a method as defined above is disclosed, wherein the shutting assembly further comprising at least one RF shielding conduit (RFSC), connected to the shutting assembly, shaped to allow passage of medical equipment tubing from the MRD bore to the external environment; further wherein the conduit is characterized by a length (l) and a width (w), l:w ratio is greater than a predefined value n, thereby providing RF shielding.

According to another embodiment of the invention, a method as defined above is disclosed, additionally comprising a step of shaping at least a portion of the RFSC to accommodate medical equipment within.

According to another embodiment of the invention, a method as defined above is disclosed, additionally comprising a step of interconnecting the RFSC to a portion selected from a group consisting of: the shutting assembly movable portion, the shutting assembly portion affixed to MRD, MRD and any combination thereof.

According to another embodiment of the invention, a method as defined above is disclosed, additionally comprising a step of forming least a portion of the conduit of electromagnetic conductive material.

According to another embodiment of the invention, a method as defined above is disclosed, additionally comprising a step of interconnecting the conduit to the shutting assembly to at least a portion of the perimeter between the shutting assembly and the MRD bore aperture.

According to another embodiment of the invention, a method as defined above is disclosed, additionally comprising a step of forming the conduit so that the conduit has an open face toward the MRD external environment, along its longitudinal axis, thereby enabling removal of medical equipment, without detaching it from any of the equipment ends.

According to another embodiment of the invention, a method as defined above is disclosed, additionally comprising a step of configuring the RFSC to attenuate electromagnetic interference by means selected from a group of: waveguide, RF filter, waveguide filter, attenuating material, and any combination thereof.

According to another embodiment of the invention, a method as defined above is disclosed, additionally comprising a step of configuring by means of shape, size and material to attenuate the passage of frequencies selected from a group consisting of: 0-1000 MHz, 0-500 MHz, 0-200 MHz and any combination thereof.

According to another embodiment of the invention, a method as defined above is disclosed, additionally comprising a step of forming the conduit profile in a shape selected from a group consisting of: cylindrical, polygonal, symmetrical, non-symmetrical and any combination thereof.

According to another embodiment of the invention, a method as defined above is disclosed, additionally comprising a step of forming the conduit length in a shape selected from a group consisting of: curved, straight, polygonal, symmetrical, non-symmetrical and any combination thereof.

According to another embodiment of the invention, a method as defined above is disclosed, additionally comprising a step of connecting at least one RF filter to at least a portion of the RFSC, thereby enabling RF shielded passage of wiring from the external environment to inner space of the MDR bore.

According to another embodiment of the invention, a method as defined above is disclosed, additionally comprising a step of shaping at least a portion of the RFSC to permit passage within of tubing of a plurality of shapes and sizes.

According to another embodiment of the invention, a method as defined above is disclosed, additionally comprising a step of connecting at least one tubing holder selected from a group consisting of: clip, anchor, concave placement, grip, clasp, clamp, strip, belt, catch, snap, fastener, hook, hold, support, buckle, latch, lock, hasp, harness, affixer, binder, joiner, band, ring, string, tie, link, chain and any combination thereof to the RFSC.

According to another embodiment of the invention, a method as defined above is disclosed, additionally comprising a step of shaping at least a portion of the conduit aperture edge in a curved profile.

According to another embodiment of the invention, a method as defined above is disclosed, additionally comprising a step of shaping at least a portion of the conduit walls edge profiles in a smoothed finish.

According to another embodiment of the invention, a method as defined above is disclosed, additionally comprising a step of forming at least a portion of the RFSC perforated, further wherein the perforations are of a length and diameter configured as a waveguide RF attenuator, thereby allowing for RF shielding together with light and air penetration into the MRD.

It is another object of the current invention to disclose a method as described above, additionally comprising a step of constructing the RFSC as a detachable module.

According to another embodiment of the invention, a method for manufacturing a shutting assembly for a magnetic resonance imaging device (MRD) bore aperture, comprising at least one first movable portion and at least one second portion affixed to the MRD, consisting steps of: (a) defining dimensions of the MRD bore aperture; (b) defining dimensions of the movement range needed for the shutting assembly moveable portion to shift between covering to uncovering the MRD bore; and (c) forming the shutting mechanism; wherein the shutting assembly further comprising a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD.

According to another embodiment of the invention, a method as defined above is disclosed, additionally comprising a step of arranging the shutting assembly such that when it is placed over the MRD bore, the aperture of the MRD bore is completely covered by the shutting assembly.

According to another embodiment of the invention, a method as defined above is disclosed, wherein the normally closed sliding mechanism retains the MRD bore aperture covered by the shutting assembly, when not applying force directly or indirectly to at least one movable portion.

According to another embodiment of the invention, a method as defined above is disclosed, wherein the normally opened sliding mechanism retains the MRD bore aperture uncovered by the shutting assembly, when not applying force directly or indirectly to at least one movable portion.

According to another embodiment of the invention, a method as defined above is disclosed, wherein self-movement of at least one moveable portion relative to at least one portion affixed to the MRD enables the MRD bore aperture to be covered or uncovered.

According to another embodiment of the invention, a method as defined above is disclosed, additionally comprising a step of force triggering the movement of at least one moveable portion relative to at least one portion affixed to the MRD enabling the MRD bore aperture to be covered or uncovered; further wherein the force is applied directly, indirectly or both.

According to another embodiment of the invention, a method as defined above is disclosed, additionally comprising a step of moving the at least one moveable portion relative to the at least one portion affixed to the MRD is by means selected from a group consisting of: manual, automatic, self or any combination thereof.

According to another embodiment of the invention, a method as defined above is disclosed, additionally comprising a step of interconnecting a motion stopping mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of releasing the motion stopping mechanism is by a means selected from a group consisting of: manual, automatic, remote control or any combination thereof.

According to another embodiment of the invention, a method as defined above is disclosed, wherein the shutting assembly further comprising an emergency brake system; further wherein the emergency brake system immediately aborts the movement of at least one movable portion.

According to another embodiment of the invention, a method as defined above is disclosed, additionally comprising a step of interconnecting the emergency brake system to a portion selected from a group consisting of: within the MRD bore, the MRD external wall, at least one movable portion, at least one portion affixed to the MRD and any combination thereof.

According to another embodiment of the invention, a method as defined above is disclosed, wherein the shutting assembly further comprising a latching mechanism; further wherein the latching mechanism secures the location of at least one movable portion in respect to at least one second portion affixed to the MRD.

According to another embodiment of the invention, a method as defined above is disclosed, additionally comprising a step of connecting the latching mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of connecting at least one affixed portion to a portion selected from a group consisting of: within the MRD bore, the MRD external wall, at least one movable portion, the sliding mechanism and any combination thereof.

According to another embodiment of the invention, a method as defined above is disclosed, additionally comprising a step of connecting at least a part of one affixed portion to the MRD external wall, in reference to the bore aperture, selected from a group consisting of: top, bottom, left side, right side, perpendicular to the floor, non-perpendicular to the floor, around at least a portion of the MRD aperture and any combination thereof.

According to another embodiment of the invention, a method as defined above is disclosed, additionally comprising a step of connecting at least a part of one moveable portion to a portion selected from a group consisting of: within the MRD bore, the MRD external wall, at least one affixed portion, the sliding mechanism and any combination thereof.

According to another embodiment of the invention, a method as defined above is disclosed, wherein the assembly additionally comprises an interlock mechanism.

According to another embodiment of the invention, a method as defined above is disclosed, additionally comprising a step of including, an object detecting system to the interlock mechanism, thereby preventing the movable portion from colliding with undesired objects.

According to another embodiment of the invention, a method as defined above is disclosed, wherein at least a portion of the assembly comprises shielding selected from a group consisting of: magnetic shielding, RF shielding, physical shielding and any combination thereof.

According to another embodiment of the invention, a method as defined above is disclosed, wherein at least a portion of the assembly comprises active magnetic shielding, passive magnetic shielding or both.

According to another embodiment of the invention, a method as defined above is disclosed, additionally comprising a step of forming at least a portion of the shutting assembly comprising transparent material.

According to another embodiment of the invention, a method as defined above is disclosed, additionally comprising a step of forming at least a portion of the shutting assembly is a semi-permeable barrier.

According to another embodiment of the invention, a method as defined above is disclosed, additionally comprising a step of forming at least a portion of the assembly comprises electromagnetic conductive material.

According to another embodiment of the invention, a method as defined above is disclosed, additionally comprising a step of forming at least a portion of the assembly comprising a material selected from a group consisting of: diamagnetic, paramagnetic, ferromagnetic materials and combination thereof.

According to another embodiment of the invention, a method as defined above is disclosed, additionally comprising a step of constructing at least a portion of the shutting assembly in layers.

According to another embodiment of the invention, a method as defined above is disclosed, additionally comprising a step of forming the first movable portion is of a shape selected from a group consisting of: round, polygonal, compound, symmetrical, non-symmetrical and any combination thereof.

According to another embodiment of the invention, a method as defined above is disclosed, additionally comprising a step of enabling quick access to the patient by a one-step release mechanism when in the MRD bore.

According to another embodiment of the invention, a method as defined above is disclosed, additionally comprising a step of connecting a thermo-regulating system, thereby regulating the air temperature within the MRD bore.

According to another embodiment of the invention, a method as defined above is disclosed, additionally comprising a step of connecting a ventilating system, thereby ventilating the inner volume of the MRD bore.

According to another embodiment of the invention, a method as defined above is disclosed, additionally comprising a step of attenuating sound at least a portion of the shutting assembly by means selected from a group consisting of: layered construct, sound absorptive material, sound isolating connections and any combination thereof.

According to another embodiment of the invention, a method as defined above is disclosed, additionally comprising a step of connecting sensing equipment sensing a physical quality selected from a group of: temperature, humidity, gas concentration, location of the moveable portion of the shutting assembly and any combination thereof.

According to another embodiment of the invention, a method as defined above is disclosed, additionally comprising a step of connecting viewing equipment enabling view of least a portion of the patient.

According to another embodiment of the invention, a method as defined above is disclosed, additionally comprising a step of connecting magnetic field detectors, maneuverable coils and feedback system to the shutting assembly.

According to another embodiment of the invention, a method as defined above is disclosed, additionally comprising a step of connecting a ferromagnetic materials detecting device; further wherein the detecting device comprises an indicator selected from a group consisting of: auditable alarm, visual alarm, sensible alarm and any combination thereof.

According to another embodiment of the invention, a method as defined above is disclosed, additionally comprising a step of forming ports, wherein the ports are configured to allow installing of modules selected from a group of: thermo-regulating, ventilating, data analyzing, viewing, monitoring, medical equipment, user interface, active magnetic shielding, ferromagnetic detecting device, and any combination thereof.

According to another embodiment of the invention, a method as defined above is disclosed, additionally comprising a step of connecting a user interface connected to equipment selected from a group consisting of: sensing, viewing, data analyzing, medical, monitoring, ferromagnetic materials detecting, magnetic field detecting, indicators and any combination thereof.

According to another embodiment of the invention, a method as defined above is disclosed, additionally comprising a step of connecting at least one RF filter, wherein the RF filter is connected to a portion selected from a group consisting of: the shutting assembly moveable portion, the shutting assembly portion affixed to the MRD, the MRD and any combination thereof, thereby enabling RF shielded passage of electrical wiring from the external environment to inner space of the MDR bore.

According to another embodiment of the invention, a method as defined above is disclosed, additionally comprising a step of closing at least a portion of the shutting assembly in a conductive circuit with at least a portion of the MRD.

According to another embodiment of the invention, a method as defined above is disclosed, wherein the shutting assembly further comprising at least one RF shielding conduit (RFSC), connected to the shutting assembly, shaped to allow passage of medical equipment tubing from the MRD bore to the external environment; further wherein the conduit is characterized by a length (l) and a width (w), l:w ratio is greater than a predefined value n, thereby providing RF shielding.

According to another embodiment of the invention, a method as defined above is disclosed, additionally comprising a step of shaping at least a portion of the conduit to accommodate medical equipment within.

According to another embodiment of the invention, a method as defined above is disclosed, additionally comprising a step of interconnecting the conduit to a portion selected from a group consisting of: the shutting assembly movable portion, the shutting assembly portion affixed to MRD, MRD and any combination thereof.

According to another embodiment of the invention, a method as defined above is disclosed, additionally comprising a step of forming least a portion of the conduit of electromagnetic conductive material.

According to another embodiment of the invention, a method as defined above is disclosed, additionally comprising a step of interconnecting the conduit to the shutting assembly to at least a portion of the perimeter between the shutting assembly and the MRD bore aperture.

According to another embodiment of the invention, a method as defined above is disclosed, additionally comprising a step of forming the conduit so that the conduit has an open face toward the MRD external environment, along its longitudinal axis, thereby enabling removal of medical equipment, without detaching it from any of the equipment ends.

According to another embodiment of the invention, a method as defined above is disclosed, additionally comprising a step of configuring the conduit to attenuate electromagnetic interference by means selected from a group of: waveguide, RF filter, waveguide filter, attenuating material, and any combination thereof.

According to another embodiment of the invention, a method as defined above is disclosed, additionally comprising a step of configuring by means of shape, size and material to attenuate the passage of frequencies selected from a group consisting of: 0-1000 MHz, 0-500 MHz, 0-200 MHz and any combination thereof.

According to another embodiment of the invention, a method as defined above is disclosed, additionally comprising a step of forming the conduit profile in a shape selected from a group consisting of: cylindrical, polygonal, symmetrical, non-symmetrical and any combination thereof.

According to another embodiment of the invention, a method as defined above is disclosed, additionally comprising a step of forming the conduit length in a shape selected from a group consisting of: curved, straight, polygonal, symmetrical, non-symmetrical and any combination thereof.

According to another embodiment of the invention, a method as defined above is disclosed, additionally comprising a step of connecting at least one RF filter to at least a portion of the conduit, thereby enabling RF shielded passage of wiring from the external environment to inner space of the MDR bore.

According to another embodiment of the invention, a method as defined above is disclosed, additionally comprising a step of shaping at least a portion of the conduit to permit passage within of tubing of a plurality of shapes and sizes.

According to another embodiment of the invention, a method as defined above is disclosed, additionally comprising a step of connecting at least one tubing holder selected from a group consisting of: clip, anchor, concave placement, grip, clasp, clamp, strip, belt, catch, snap, fastener, hook, hold, support, buckle, latch, lock, hasp, harness, affixer, binder, joiner, band, ring, string, tie, link, chain and any combination thereof to the RFSC.

According to another embodiment of the invention, a method as defined above is disclosed, additionally comprising a step of shaping at least a portion of the conduit aperture edge in a curved profile.

According to another embodiment of the invention, a method as defined above is disclosed, additionally comprising a step of shaping at least a portion of the conduit walls edge profiles in a smoothed finish.

According to another embodiment of the invention, a method as defined above is disclosed, additionally comprising a step of forming at least a portion of the conduit perforated, further wherein the perforations are of a length and diameter configured as a waveguide RF attenuator, thereby allowing for RF shielding together with light and air penetration into the MRD.

According to another embodiment of the invention, a method as defined above is disclosed, additionally comprising a step of constructing the conduit as a detachable module.

According to another embodiment of the invention, a method for RF shielding the passage of medical equipment to MRD bore comprising steps of: obtaining a shutting assembly for a magnetic resonance device (MRD) bore aperture, comprising at least one first movable portion and at least one second portion affixed to the MRD, further comprising at least one conduit shaped to allow passage of medical equipment from the MRD bore to the external environment, (a) installing the shutting assembly; (b) placing patient within the MRI bore; (c) passing medical equipment though the conduit; (d) shutting the MRD bore by utilizing the shutting assembly sliding mechanism; and (e) imaging patient, wherein the conduit is characterized by a length (l) and width (w), l:w ratio is greater than a predefined value n, thereby providing RF shielding.

According to another embodiment of the invention, a method as defined above is disclosed, additionally comprising a step of arranging the shutting assembly such that when it is placed over the MRD bore, the aperture of the MRD bore is completely covered by the shutting assembly.

According to another embodiment of the invention, a method as defined above is disclosed, wherein the normally closed sliding mechanism retains the MRD bore aperture covered by the shutting assembly, when not applying force directly or indirectly to at least one movable portion.

According to another embodiment of the invention, a method as defined above is disclosed, wherein the normally opened sliding mechanism retains the MRD bore aperture uncovered by the shutting assembly, when not applying force directly or indirectly to at least one movable portion.

According to another embodiment of the invention, a method as defined above is disclosed, wherein self-movement of at least one moveable portion relative to at least one portion affixed to the MRD enables the MRD bore aperture to be covered or uncovered.

According to another embodiment of the invention, a method as defined above is disclosed, additionally comprising a step of force triggering the movement of at least one moveable portion relative to at least one portion affixed to the MRD enabling the MRD bore aperture to be covered or uncovered; further wherein the force is applied directly, indirectly or both.

According to another embodiment of the invention, a method as defined above is disclosed, additionally comprising a step of moving the at least one moveable portion relative to the at least one portion affixed to the MRD is by means selected from a group consisting of: manual, automatic, self or any combination thereof.

According to another embodiment of the invention, a method as defined above is disclosed, additionally comprising a step of interconnecting a motion stopping mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of releasing the motion stopping mechanism is by a means selected from a group consisting of: manual, automatic, remote control or any combination thereof.

According to another embodiment of the invention, a method as defined above is disclosed, wherein the shutting assembly further comprising an emergency brake system;

further wherein the emergency brake system immediately aborts the movement of at least one movable portion.

According to another embodiment of the invention, a method as defined above is disclosed, additionally comprising a step of interconnecting the emergency brake system to a portion selected from a group consisting of: within the MRD bore, the MRD external wall, at least one movable portion, at least one portion affixed to the MRD and any combination thereof.

According to another embodiment of the invention, a method as defined above is disclosed, wherein the shutting assembly further comprising a latching mechanism; further wherein the latching mechanism secures the location of at least one movable portion in respect to at least one second portion affixed to the MRD.

According to another embodiment of the invention, a method as defined above is disclosed, additionally comprising a step of connecting the latching mechanism to at least a portion selected from a group consisting of: within the MRD bore, the MRD external wall, at least one movable portion, at least one portion affixed to the MRD and any combination thereof.

According to another embodiment of the invention, a method as defined above is disclosed, additionally comprising a step of connecting at least one affixed portion to a portion selected from a group consisting of: within the MRD bore, the MRD external wall, at least one movable portion, the sliding mechanism and any combination thereof.

According to another embodiment of the invention, a method as defined above is disclosed, additionally comprising a step of connecting at least a part of one affixed portion to the MRD external wall, in reference to the bore aperture, selected from a group consisting of: top, bottom, left side, right side, perpendicular to the floor, non-perpendicular to the floor, around at least a portion of the MRD aperture and any combination thereof.

According to another embodiment of the invention, a method as defined above is disclosed, additionally comprising a step of connecting at least a part of one moveable portion to a portion selected from a group consisting of: within the MRD bore, the MRD external wall, at least one affixed portion, the sliding mechanism and any combination thereof.

According to another embodiment of the invention, a method as defined above is disclosed, wherein the assembly additionally comprises an interlock mechanism.

According to another embodiment of the invention, a method as defined above is disclosed, additionally comprising a step of including an object detecting system to the interlock mechanism, thereby preventing the movable portion from colliding with undesired objects.

According to another embodiment of the invention, a method as defined above is disclosed, wherein at least a portion of the assembly comprises shielding selected from a group consisting of: magnetic shielding, RF shielding, physical shielding and any combination thereof.

According to another embodiment of the invention, a method as defined above is disclosed, wherein at least a portion of the assembly comprising active magnetic shielding, passive magnetic shielding or both.

According to another embodiment of the invention, a method as defined above is disclosed, additionally comprising a step of forming at least a portion of the shutting assembly comprising transparent material.

According to another embodiment of the invention, a method as defined above is disclosed, additionally comprising a step of forming at least a portion of the shutting assembly is a semi-permeable barrier.

According to another embodiment of the invention, a method as defined above is disclosed, additionally comprising a step of forming at least a portion of the assembly comprising electromagnetic conductive material.

According to another embodiment of the invention, a method as defined above is disclosed, additionally comprising a step of forming at least a portion of the assembly comprising a material selected from a group consisting of: diamagnetic, paramagnetic, ferromagnetic materials and combination thereof.

According to another embodiment of the invention, a method as defined above is disclosed, additionally comprising a step of constructing at least a portion of the shutting assembly in layers.

According to another embodiment of the invention, a method as defined above is disclosed, additionally comprising a step of forming the first movable portion is of a shape selected from a group consisting of: round, polygonal, compound, symmetrical, non-symmetrical and any combination thereof.

According to another embodiment of the invention, a method as defined above is disclosed, additionally comprising a step of enabling quick access to the patient by a one-step release mechanism when in the MRD bore.

According to another embodiment of the invention, a method as defined above is disclosed, additionally comprising a step of connecting a thermo-regulating system, thereby regulating the air temperature within the MRD bore.

According to another embodiment of the invention, a method as defined above is disclosed, additionally comprising a step of connecting a ventilating system, thereby ventilating the inner volume of the MRD bore.

According to another embodiment of the invention, a method as defined above is disclosed, additionally comprising a step of attenuating sound at least a portion of the shutting assembly by means selected from a group consisting of: layered construct, sound absorptive material, sound isolating connections and any combination thereof.

According to another embodiment of the invention, a method as defined above is disclosed, additionally comprising a step of connecting sensing equipment sensing a physical quality selected from a group of: temperature, humidity, gas concentration, location of the moveable portion of the shutting assembly and any combination thereof.

According to another embodiment of the invention, a method as defined above is disclosed, additionally comprising a step of connecting viewing equipment enabling view of least a portion of the patient.

According to another embodiment of the invention, a method as defined above is disclosed, additionally comprising a step of connecting magnetic field detectors, maneuverable coils and feedback system to the shutting assembly.

According to another embodiment of the invention, a method as defined above is disclosed, additionally comprising a step of connecting a ferromagnetic materials detecting device; further wherein the detecting device comprises an indicator selected from a group consisting of: auditable alarm, visual alarm, sensible alarm and any combination thereof.

According to another embodiment of the invention, a method as defined above is disclosed, additionally comprising a step of forming ports, wherein the ports are configured to allow installing of modules selected from a group of: thermo-regulating, ventilating, data analyzing, viewing, monitoring, medical equipment, user interface, active magnetic shielding, ferromagnetic detecting device, and any combination thereof.

According to another embodiment of the invention, a method as defined above is disclosed, additionally comprising a step of connecting a user interface connected to equipment selected from a group consisting of: sensing, viewing, data analyzing, medical, monitoring, ferromagnetic materials detecting, magnetic field detecting, indicators and any combination thereof.

According to another embodiment of the invention, a method as defined above is disclosed, additionally comprising a step of connecting at least one RF filter, wherein the RF filter is connected to a portion selected from a group consisting of: the shutting assembly moveable portion, the shutting assembly portion affixed to the MRD, the MRD and any combination thereof, thereby enabling RF shielded passage of electrical wiring from the external environment to inner space of the MDR bore.

According to another embodiment of the invention, a method as defined above is disclosed, additionally comprising a step of closing at least a portion of the shutting assembly in a conductive circuit with at least a portion of the MRD.

According to another embodiment of the invention, a method as defined above is disclosed, wherein the shutting assembly further comprising at least one RF shielding conduit (RFSC), connected to the shutting assembly, shaped to allow passage of medical equipment tubing from the MRD bore to the external environment; further wherein the conduit is characterized by a length (l) and a width (w), l:w ratio is greater than a predefined value n, thereby providing RF shielding.

According to another embodiment of the invention, a method as defined above is disclosed, additionally comprising a step of shaping at least a portion of the RFSC to accommodate medical equipment within.

According to another embodiment of the invention, a method as defined above is disclosed, additionally comprising a step of interconnecting the RFSC to a portion selected from a group consisting of: the shutting assembly movable portion, the shutting assembly portion affixed to MRD, MRD and any combination thereof.

According to another embodiment of the invention, a method as defined above is disclosed, additionally comprising a step of forming least a portion of the conduit of electromagnetic conductive material.

According to another embodiment of the invention, a method as defined above is disclosed, additionally comprising a step of interconnecting the conduit to the shutting assembly to at least a portion of the perimeter between the shutting assembly and the MRD bore aperture.

According to another embodiment of the invention, a method as defined above is disclosed, additionally comprising a step of forming the conduit so that the conduit has an open face toward the MRD external environment, along its longitudinal axis, thereby enabling removal of medical equipment, without detaching it from any of the equipment ends.

According to another embodiment of the invention, a method as defined above is disclosed, additionally comprising a step of configuring the RFSC to attenuate electromagnetic interference by means selected from a group of: waveguide, RF filter, waveguide filter, attenuating material, and any combination thereof.

According to another embodiment of the invention, a method as defined above is disclosed, additionally comprising a step of configuring by means of shape, size and material to attenuate the passage of frequencies selected from a group consisting of: 0-1000 MHz, 0-500 MHz, 0-200 MHz and any combination thereof.

According to another embodiment of the invention, a method as defined above is disclosed, additionally comprising a step of forming the conduit profile in a shape selected from a group consisting of: cylindrical, polygonal, symmetrical, non-symmetrical and any combination thereof.

According to another embodiment of the invention, a method as defined above is disclosed, additionally comprising a step of forming the conduit length in a shape selected from a group consisting of: curved, straight, polygonal, symmetrical, non-symmetrical and any combination thereof.

According to another embodiment of the invention, a method as defined above is disclosed, additionally comprising a step of connecting at least one RF filter to at least a portion of the conduit, thereby enabling RF shielded passage of wiring from the external environment to inner space of the MDR bore.

According to another embodiment of the invention, a method as defined above is disclosed, additionally comprising a step of shaping at least a portion of the conduit to permit passage within of tubing of a plurality of shapes and sizes.

According to another embodiment of the invention, a method as defined above is disclosed, additionally comprising a step of connecting at least one tubing holder selected from a group consisting of: clip, anchor, concave placement, grip, clasp, clamp, strip, belt, catch, snap, fastener, hook, hold, support, buckle, latch, lock, hasp, harness, affixer, binder, joiner, band, ring, string, tie, link, chain and any combination thereof to the conduit.

According to another embodiment of the invention, a method as defined above is disclosed, additionally comprising a step of shaping at least a portion of the conduit aperture edge in a curved profile.

According to another embodiment of the invention, a method as defined above is disclosed, additionally comprising a step of shaping at least a portion of the conduit walls edge profiles in a smoothed finish.

According to another embodiment of the invention, a method as defined above is disclosed, additionally comprising a step of forming at least a portion of the conduit perforated, further wherein the perforations are of a length and diameter configured as a waveguide RF attenuator, thereby allowing for RF shielding together with light and air penetration into the MRD.

According to another embodiment of the invention, a method as defined above is disclosed, additionally comprising a step of constructing the conduit as a detachable module.

According to another embodiment of the invention, a standard of care protocol is disclosed for magnetic resonance imaging a patient placed within MRD bore, connected to medical equipment, whilst not leaking RF into the MRD and from the MRD, characterized by providing a shutting assembly for a magnetic resonance imaging device (MRD) bore aperture, comprising at least one first movable portion and at least one second portion affixed to the MRD, the shutting assembly further comprising a normally closed or normally open sliding mechanism, further the sliding mechanism couples at least one first moveable portion to at least one second portion affixed to the MRD, further comprising at least one RF shielding conduit (RFSC), connected to the shutting assembly, shaped to allow passage of medical equipment tubing from the MRD bore to the external environment; further the conduit is characterized by a length (l) and a width (w), l:w ratio is greater than a predefined value n, thereby providing RF shielding, wherein at least one of the following is held true: (a) the average number of MRD associated patient's health complications due to detaching and attaching medical equipment to the patient is i times higher than when utilizing the shutting assembly i is equal or greater than 1.05; (b) the average number of insurable claims of a selected from a group consisting of: manufacturer, handler, user, operator, medical care personal, medical facility, medical facility management or any combination thereof when utilizing the shutting assembly is m times lower than patient MRI associated insurable claims; m is equal or greater than 1.05; (c) the average number of repeated MRI due to EMI created artifacts when utilizing the shutting assembly is p times lower than the average number of repeated MRI; p is equal or greater than 1.05; (d) the average number of reported incidents of EMI interfering with medical equipment during MRI when utilizing the shutting assembly is s times lower than the average number of reported incidents of EMI interfering with medical equipment during MRI; s is equal or greater than 1.05; (e) the average stress levels of patients measured by the average levels of the patient salival cortisol during MRI when utilizing the shutting assembly is t times lower than the average stress levels of patients during MRI; t is equal or greater than 1.05; (f) the average number of patient's health complications due to artifacts in MRD images caused by EMI is r times higher than when utilizing the shutting assembly; r is equal or greater than 1.05; (g) the average number of patient's health complications due EMI interfering with medical equipment is u times higher than when utilizing the shutting assembly; u is equal or greater than 1.05; (h) the average number of EMI incidents of interfering with imaging equipment is w times higher than when utilizing the shutting assembly; w is equal or greater than 1.05; and (i) the average number of projectile ferromagnetic elements related incidents is v times higher than when utilizing the shutting assembly; v is equal or greater than 1.05.

According to one embodiment of the invention, a shutting assembly for a magnetic resonance imaging device (MRD) bore aperture, comprising at least one first movable portion and at least one second portion affixed to the MRD, wherein the shutting assembly further comprises a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD; further wherein the shutting assembly is arranged such that when the shutting assembly moveable portion is placed over the MRD bore, the MRD bore aperture is completely covered by the shutting assembly; further wherein the normally closed sliding mechanism retains the MRD bore aperture covered by the shutting assembly, when force is not applied directly or indirectly to at least one movable portion; further wherein the normally opened sliding mechanism retains the MRD bore aperture uncovered by the shutting assembly, when force is not applied directly or indirectly to at least one movable portion; further wherein self-movement of at least one moveable portion relative to at least one portion affixed to the MRD enables the MRD bore aperture to be covered in the normally closed sliding mechanism or uncovered in the normally opened sliding mechanism; further wherein force triggered movement of at least one moveable portion relative to at least one portion affixed to the MRD enables the MRD bore aperture to be covered in the normally opened sliding mechanism, or uncovered in a normally closed sliding mechanism; further wherein the force is applied directly, indirectly or both.

According to one embodiment of the invention, a shutting assembly for a magnetic resonance imaging device (MRD) bore aperture, comprising at least one first movable portion and at least one second portion affixed to the MRD, wherein the shutting assembly further comprises a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD; further wherein the shutting assembly is arranged such that when the shutting assembly moveable portion is placed over the MRD bore, the MRD bore aperture is completely covered by the shutting assembly; further wherein movement of at least one moveable portion relative to at least one portion affixed to the MRD is achieved by means selected from a group consisting of: manual, automatic, self or any combination thereof; further wherein, the assembly further comprising at least one motion stopping mechanism, wherein the motion stopping mechanism is interconnected to a portion selected from a group consisting of: the MRD bore, the MRD external wall, at least one movable portion, at least one portion affixed to the MRD and any combination thereof.

According to one embodiment of the invention, a shutting assembly for a magnetic resonance imaging device (MRD) bore aperture, comprising at least one first movable portion and at least one second portion affixed to the MRD, wherein the shutting assembly further comprising a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD; further wherein the shutting assembly is arranged such that when the shutting assembly moveable portion is placed over the MRD bore, the MRD bore aperture is completely covered by the shutting assembly; further wherein movement of at least one moveable portion relative to at least one portion affixed to the MRD is achieved by means selected from a group consisting of: manual, automatic, self or any combination thereof; further wherein at least one affixed portion is connected to a selected from a group consisting of: the MRD bore, the MRD external wall, at least one movable portion, the sliding mechanism and any combination thereof; further wherein at least a part of one affixed portion is connected to the MRD external wall, in reference to the bore aperture, selected from a group consisting of: above, below, on top, bottom, left side, right side, perpendicular to the floor, non-perpendicular to the floor, around at least a portion of the MRD aperture, and any combination thereof; further wherein at least a part of one moveable portion is reversibly connected to a selected from a group consisting of: the MRD bore, the MRD external wall, at least one affixed portion, the sliding mechanism and any combination thereof; further wherein at least a portion of the shutting assembly comprises shielding selected from a group consisting of: magnetic shielding, RF shielding, physical shielding and any combination thereof; further wherein at least a portion of the shutting assembly comprises an at least partially transparent material; further wherein at least a portion of the shutting assembly is a semi-permeable barrier; further wherein the assembly further comprising a one-step release mechanism, wherein the mechanism enables quick access to the patient when in the MRD bore. According to one embodiment of the invention, a shutting assembly for a magnetic resonance imaging device (MRD) bore aperture, comprising at least one first movable portion and at least one second portion affixed to the MRD, wherein the shutting assembly further comprising a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD; further wherein the shutting assembly is arranged such that when the shutting assembly moveable portion is placed over the MRD bore, the MRD bore aperture is completely covered by the shutting assembly; further wherein movement of at least one moveable portion relative to at least one portion affixed to the MRD is achieved by means selected from a group consisting of: manual, automatic, self or any combination thereof; further wherein at least one affixed portion is connected to a selected from a group consisting of: the MRD bore, the MRD external wall, at least one movable portion, the sliding mechanism and any combination thereof; further wherein at least a part of one affixed portion is connected to the MRD external wall, in reference to the bore aperture, selected from a group consisting of: above, below, on top, bottom, left side, right side, perpendicular to the floor, non-perpendicular to the floor, around at least a portion of the MRD aperture, and any combination thereof; further wherein at least a part of one moveable portion is reversibly connected to a selected from a group consisting of: the MRD bore, the MRD external wall, at least one affixed portion, the sliding mechanism and any combination thereof; further wherein at least a portion of the shutting assembly comprises shielding selected from a group consisting of: magnetic shielding, RF shielding, physical shielding and any combination thereof; further wherein at least a portion of the shutting assembly comprises an at least partially transparent material; further wherein at least a portion of the shutting assembly is a semi-permeable barrier; further wherein the assembly further comprising a one-step release mechanism, wherein the mechanism enables quick access to the patient when in the MRD bore.

According to one embodiment of the invention, a shutting assembly for a magnetic resonance imaging device (MRD) bore aperture, comprising at least one first movable portion and at least one second portion affixed to the MRD, wherein the shutting assembly further comprises a normally closed or normally open sliding mechanism, further wherein the sliding mechanism couples at least one first moveable portion to at least one second portion affixed to the MRD, thereby enabling a reciprocal movement of at least one first moveable portion parallel to the MRD bore aperture in an upwards and downwards directions in respect to at least one second portion affixed to the MRD; further wherein the shutting assembly is arranged such that when the shutting assembly moveable portion is placed over the MRD bore, the MRD bore aperture is completely covered by the shutting assembly; further wherein movement of at least one moveable portion relative to at least one portion affixed to the MRD is achieved by means selected from a group consisting of: manual, automatic, self or any combination thereof; further wherein the shutting assembly further comprising at least one RF shielding conduit (RFSC), connected to the shutting assembly, shaped to allow passage of medical equipment tubing from the MRD bore to the external environment; further wherein the conduit is characterized by a length (l) and a width (w), l:w ratio is greater than a predefined value n, thereby providing RF shielding; further wherein at least a portion of the RFSC is shaped to accommodate medical equipment within; further wherein The RFSC according to claim 16, wherein the RFSC is interconnected to a portion selected from a group consisting of: the shutting assembly movable portion, the shutting assembly portion affixed to the MRD, the MRD and any combination thereof; further wherein the RFSC is configured to attenuate electromagnetic interference by means selected from a group of: waveguide, RF filter, waveguide filter, attenuating material, and any combination thereof; further wherein the RFSC is configured by means of shape, size and material to attenuate the passage of frequencies selected from a group consisting of: 0-1000 MHz, 0-500 MHz, 0-200 MHz and any combination thereof; further wherein the RFSC shape is selected from a group consisting of: cylindrical, polygonal, symmetrical, non-symmetrical, opened, closed, curved, multifaceted and any combination thereof.

The invention claimed is:

1. A shutting assembly for a magnetic resonance imaging device (MRD) bore aperture, comprising at least one first movable portion and at least one second portion affixed to said MRD, wherein said shutting assembly further comprising a normally closed or normally open sliding mechanism, further wherein said sliding mechanism couples at least one first moveable portion to at least one said second portion affixed to the MRD, thereby enabling a reciprocal movement of at least one said first moveable portion parallel to said MRD bore aperture in an upwards and downwards directions in respect to at least one said second portion affixed to said MRD, wherein said shutting assembly further comprises at least one RF shielding conduit (RFSC).

2. The shutting assembly according to claim 1, wherein said shutting assembly is arranged such that when said shutting assembly moveable portion is placed over said MRD bore, said MRD bore aperture is completely covered by said shutting assembly.

3. The shutting assembly according to claim 1, wherein said normally closed sliding mechanism retains said MRD bore aperture covered by said shutting assembly, when force is not applied directly or indirectly to at least one said movable portion.

4. The shutting assembly according to claim 1, wherein said normally opened sliding mechanism retains said MRD bore aperture uncovered by said shutting assembly, when force is not applied directly or indirectly to at least one said movable portion.

5. The shutting assembly according to claim 1, wherein self-movement of at least one said moveable portion relative to at least one said portion affixed to said MRD enables said MRD bore aperture to be covered in said normally closed sliding mechanism or uncovered in said normally opened sliding mechanism.

6. The shutting assembly according to claim 1, wherein force triggered movement of at least one said moveable portion relative to at least one said portion affixed to said MRD enables said MRD bore aperture to be covered in said normally opened sliding mechanism, or uncovered in a normally closed sliding mechanism; further wherein said force is applied directly, indirectly or both.

7. The shutting assembly according to claim 1, wherein movement of said at least one moveable portion relative to said at least one portion affixed to said MRD is achieved by means selected from a group consisting of: manual, automatic, self or any combination thereof.

8. The shutting assembly according to claim 1, comprising at least one motion stopping mechanism, wherein said motion stopping mechanism is interconnected to a portion selected from a group consisting of: said MRD bore, said MRD external wall, at least one said movable portion, at least one said portion affixed to said MRD and any combination thereof.

9. The shutting assembly according to claim 1, wherein at least one said affixed portion is connected to a selected from a group consisting of: said MRD bore, said MRD external wall, at least one said movable portion, said sliding mechanism and any combination thereof.

10. The shutting assembly according to claim 1, wherein at least a part of one said affixed portion is connected to said MRD external wall, in reference to said bore aperture, selected from a group consisting of: above, below, on top, bottom, left side, right side, perpendicular to the floor, non-perpendicular to the floor, around at least a portion of said MRD aperture, and any combination thereof.

11. The shutting assembly according to claim 1, wherein at least a part of one said moveable portion is reversibly connected to a selected from a group consisting of: said MRD bore, said MRD external wall, at least one said affixed portion, said sliding mechanism and any combination thereof.

12. The shutting assembly according to claim 1, wherein at least a portion of said shutting assembly comprises shielding selected from a group consisting of: magnetic shielding, RF shielding, physical shielding and any combination thereof.

13. The shutting assembly according to claim 1, wherein at least a portion of said shutting assembly comprises an at least partially transparent material.

14. The shutting system according to claim 1, wherein at least a portion of said shutting assembly is a semi-permeable barrier.

15. The shutting assembly according to claim 1, further comprising a one-step release mechanism, wherein said mechanism enables quick access to said patient when in said MRD bore.

16. The shutting assembly according to claim 1, wherein said RF shielding conduit (RFSC) is, shaped to allow passage of medical equipment tubing from said MRD bore to the external environment; further wherein said conduit is characterized by a length (l) and a width (w), l:w ratio is greater than a predefined value n, thereby providing RF shielding.

17. The shutting assembly according to claim 16, wherein at least a portion of said RFSC is shaped to accommodate medical equipment within.

18. The shutting assembly according to claim 16, wherein said RFSC is interconnected to a portion selected from a group consisting of: said shutting assembly movable portion, said shutting assembly portion affixed to said MRD, said MRD and any combination thereof.

19. The shutting assembly according to claim 16, wherein said RFSC is configured to attenuate electromagnetic interference by means selected from a group of: waveguide, RF filter, waveguide filter, attenuating material, and any combination thereof.

20. The shutting assembly according to claim 16, wherein said RFSC is configured by means of shape, size and material to attenuate the passage of frequencies selected from a group consisting of: 0-1000 MHz, 0-500 MHz, 0-200 MHz and any combination thereof.

21. The shutting assembly according to claim 16, wherein said RFSC shape is selected from a group consisting of: cylindrical, polygonal, symmetrical, non-symmetrical, opened, closed, curved, multifaceted and any combination thereof.

22. A method for RF shielding the passage of medical equipment to MRD bore comprising steps of:
   a. obtaining a shutting assembly for a magnetic resonance device (MRD) bore aperture, comprising at least one first movable portion and at least one second portion affixed to the MRD, further comprising at least one conduit shaped to allow passage of medical equipment from said MRD bore to the external environment,
   a. installing said shutting assembly;
   b. placing patient within said MRI bore;
   c. passing medical equipment though said conduit;
   d. shutting said MRD bore by utilizing said shutting assembly sliding mechanism; and
   e. imaging patient.

* * * * *